United States Patent
Nishiyama et al.

(10) Patent No.: US 8,492,754 B2
(45) Date of Patent: Jul. 23, 2013

(54) ORGANIC LIGHT-EMITTING DISPLAY PANEL, DISPLAY DEVICE, AND METHOD OF MANUFACTURING ORGANIC LIGHT-EMITTING DISPLAY PANEL

(75) Inventors: Seiji Nishiyama, Osaka (JP); Tetsuro Kondoh, Osaka (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 13/221,126

(22) Filed: Aug. 30, 2011

(65) Prior Publication Data

US 2012/0032207 A1 Feb. 9, 2012

Related U.S. Application Data

(63) Continuation of application No. PCT/JP2010/004990, filed on Aug. 6, 2010.

(51) Int. Cl.
  *H01L 35/24* (2006.01)
  *H01L 21/00* (2006.01)

(52) U.S. Cl.
  USPC ............... 257/40; 257/89; 257/98; 257/432; 257/E27.119; 257/E51.022; 438/35; 438/43; 438/82; 438/99

(58) Field of Classification Search
  None
  See application file for complete search history.

(56) References Cited

U.S. PATENT DOCUMENTS

| | | | |
|---|---|---|---|
| 5,443,922 A | 8/1995 | Nishizaki et al. | |
| 6,518,621 B1 | 2/2003 | Hshieh et al. | |
| 6,545,315 B2 | 4/2003 | Hshieh et al. | |
| 6,815,903 B2 | 11/2004 | Nakanishi | |
| 7,888,867 B2 | 2/2011 | Yoshida et al. | |
| 2001/0008788 A1 | 7/2001 | Hshieh et al. | |
| 2003/0146710 A1 | 8/2003 | Nakanishi | |
| 2007/0057264 A1* | 3/2007 | Matsuda | 257/88 |
| 2010/0213827 A1 | 8/2010 | Yoshida et al. | |
| 2012/0025224 A1* | 2/2012 | Yuasa | 257/89 |
| 2012/0091439 A1* | 4/2012 | Nishiyama et al. | 257/40 |

FOREIGN PATENT DOCUMENTS

| | | |
|---|---|---|
| JP | 5-163488 | 6/1993 |
| JP | 2003-022035 | 1/2003 |
| JP | 2003-241683 | 8/2003 |

(Continued)

OTHER PUBLICATIONS

U.S. Appl. No. 13/217,564 to Tetsuro Kondoh et al., filed Aug. 25, 2011.

(Continued)

*Primary Examiner* — Alonzo Chambliss

(74) *Attorney, Agent, or Firm* — Greenblum & Bernstein, P.L.C.

(57) ABSTRACT

An organic light-emitting display panel is provided that improves luminous efficiency and luminescent color by adjusting the difference in film thickness between layers of different luminescent colors, such as intermediate layers, when the intermediate layer and light-emitting layers are formed by a wet method. By varying the film thickness of an interlayer insulation film, which is a lower layer of an organic light-emitting element, the volume of a contact hole is varied by color, thereby adjusting the volume of a concavity in each anode plate. When ink that includes material for the intermediate layer, or like, is sprayed by an inkjet method, the film thickness of the intermediate layer, or like, changes in accordance with the amount of ink filing the concavity. Therefore, by adjusting the difference in volume between concavities of different colors, the difference in film thickness between the intermediate layers, or like, is finely adjusted.

27 Claims, 14 Drawing Sheets

FOREIGN PATENT DOCUMENTS

| | | |
|---|---|---|
| JP | 2004-514265 | 5/2004 |
| JP | 2005-157300 | 6/2005 |
| JP | 2008-300611 | 12/2008 |
| JP | 2010-097697 | 4/2010 |
| WO | 01/20656 | 3/2001 |
| WO | 2009/084209 | 7/2009 |

OTHER PUBLICATIONS

International Search Report in PCT/JP2010/004990, dated Nov. 16, 2010.

* cited by examiner

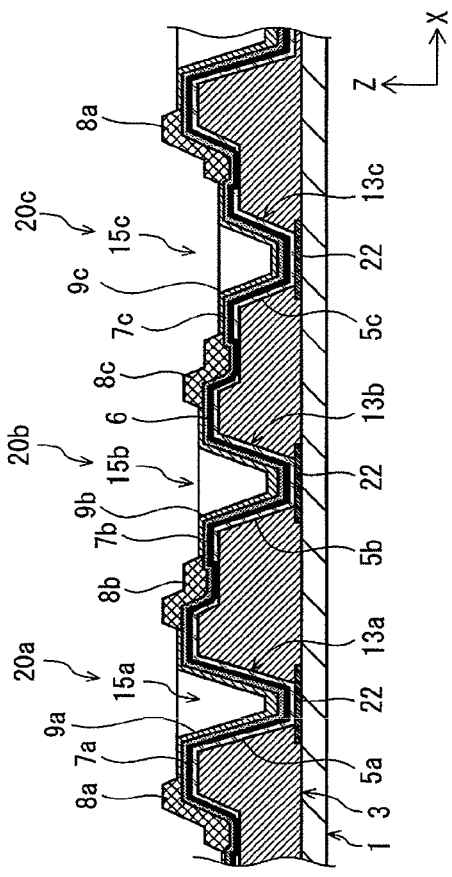
FIG. 3B Cross-section diagram (A-A')
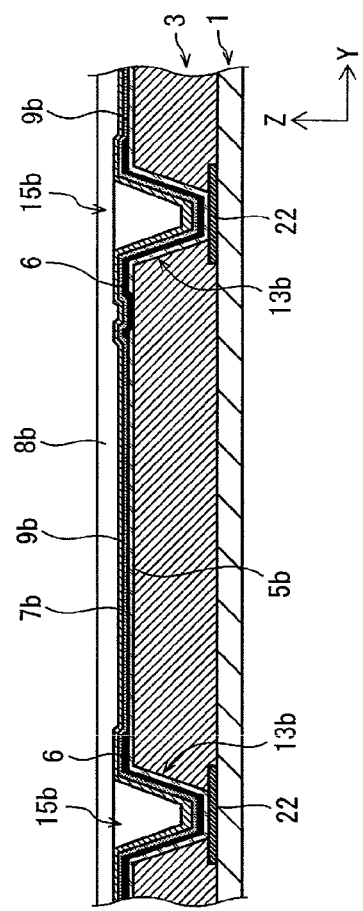
FIG. 3C Cross-section diagram (B-B')
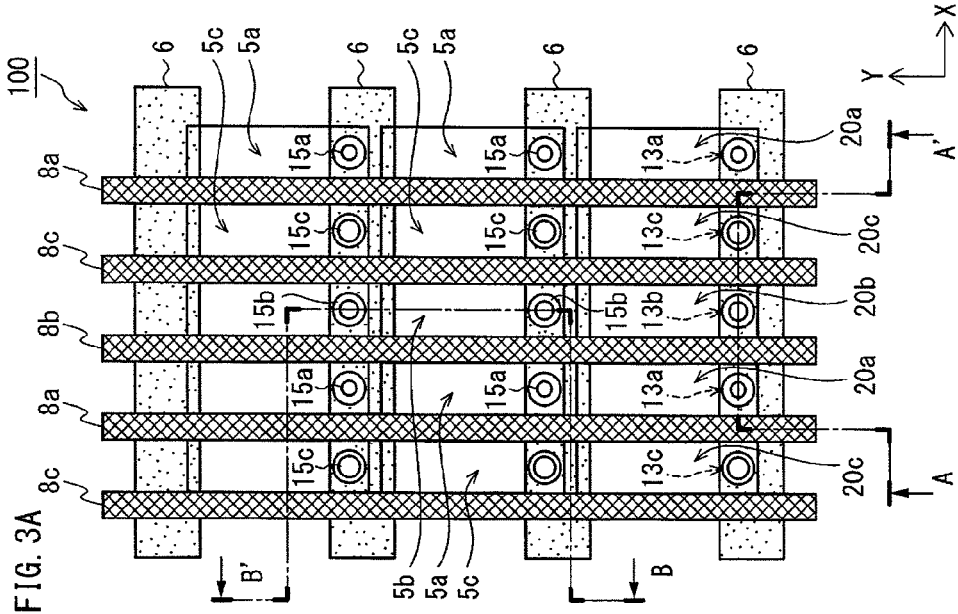
FIG. 3A

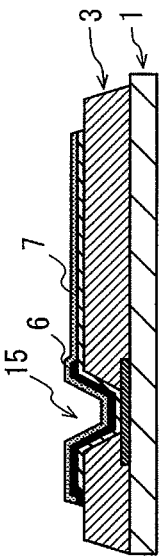
FIG. 4A Formation of TFT layer
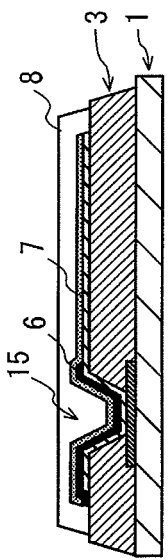
FIG. 4B Formation of interlayer insulation film
FIG. 4C Formation of anode plate
FIG. 4D Formation of pixel defining layer
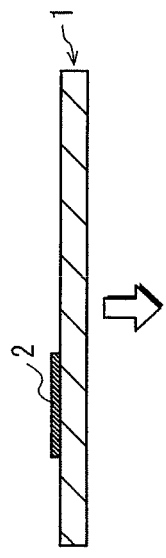
FIG. 4E Formation of hole-injection layer
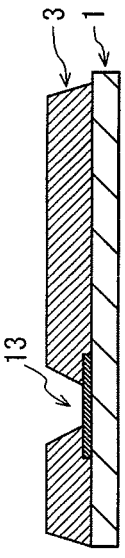
FIG. 4F Formation of bank
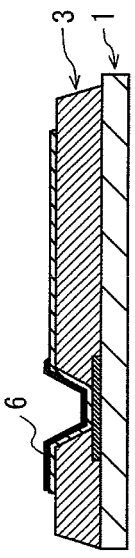
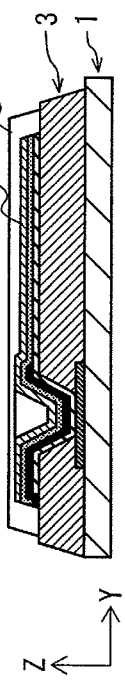
FIG. 4G Formation of intermediate layer

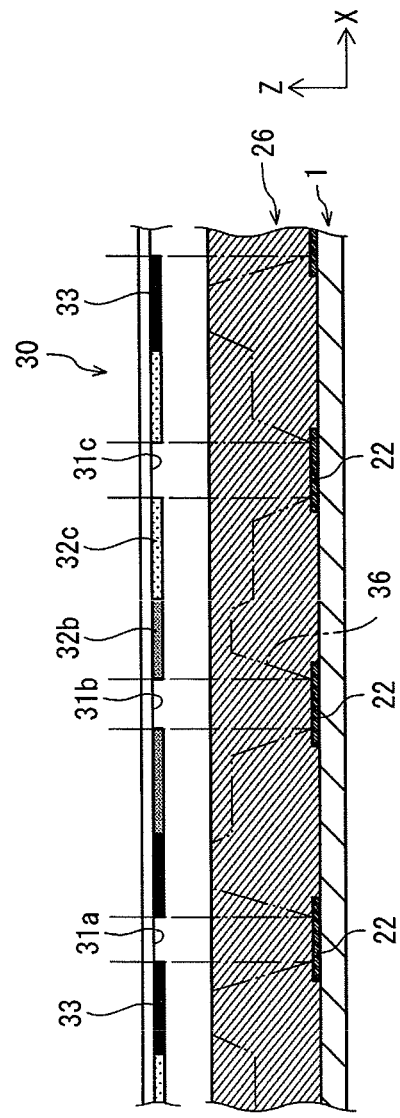
FIG. 5A Exposure
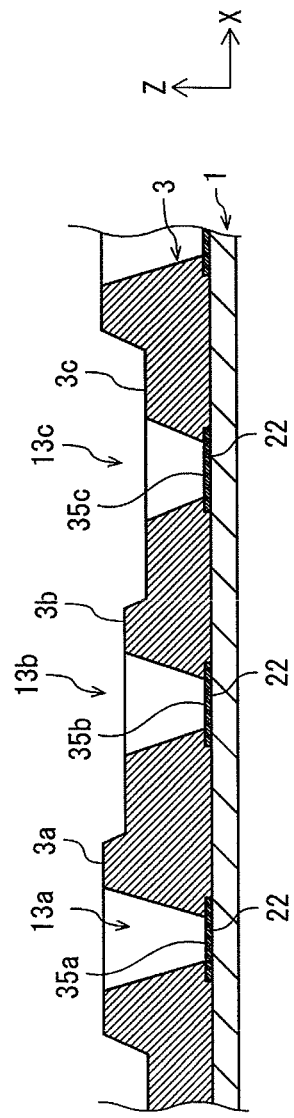
FIG. 5B Developing

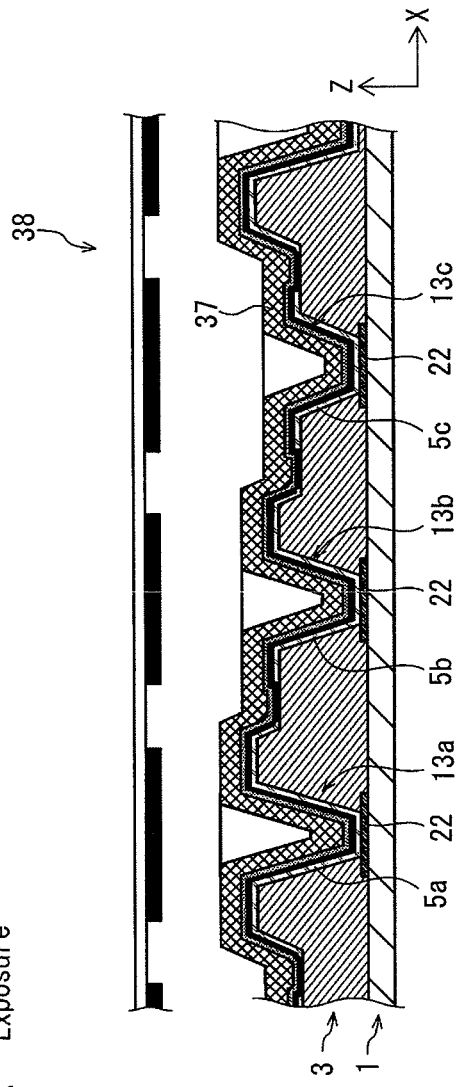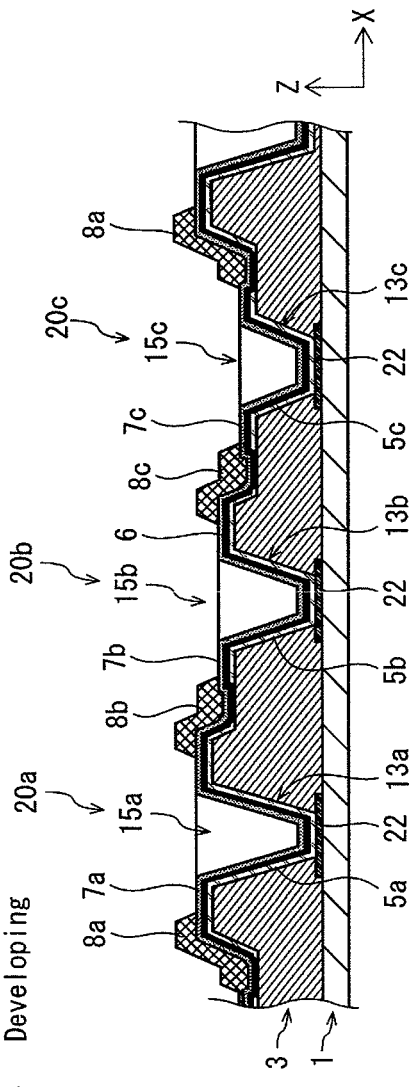

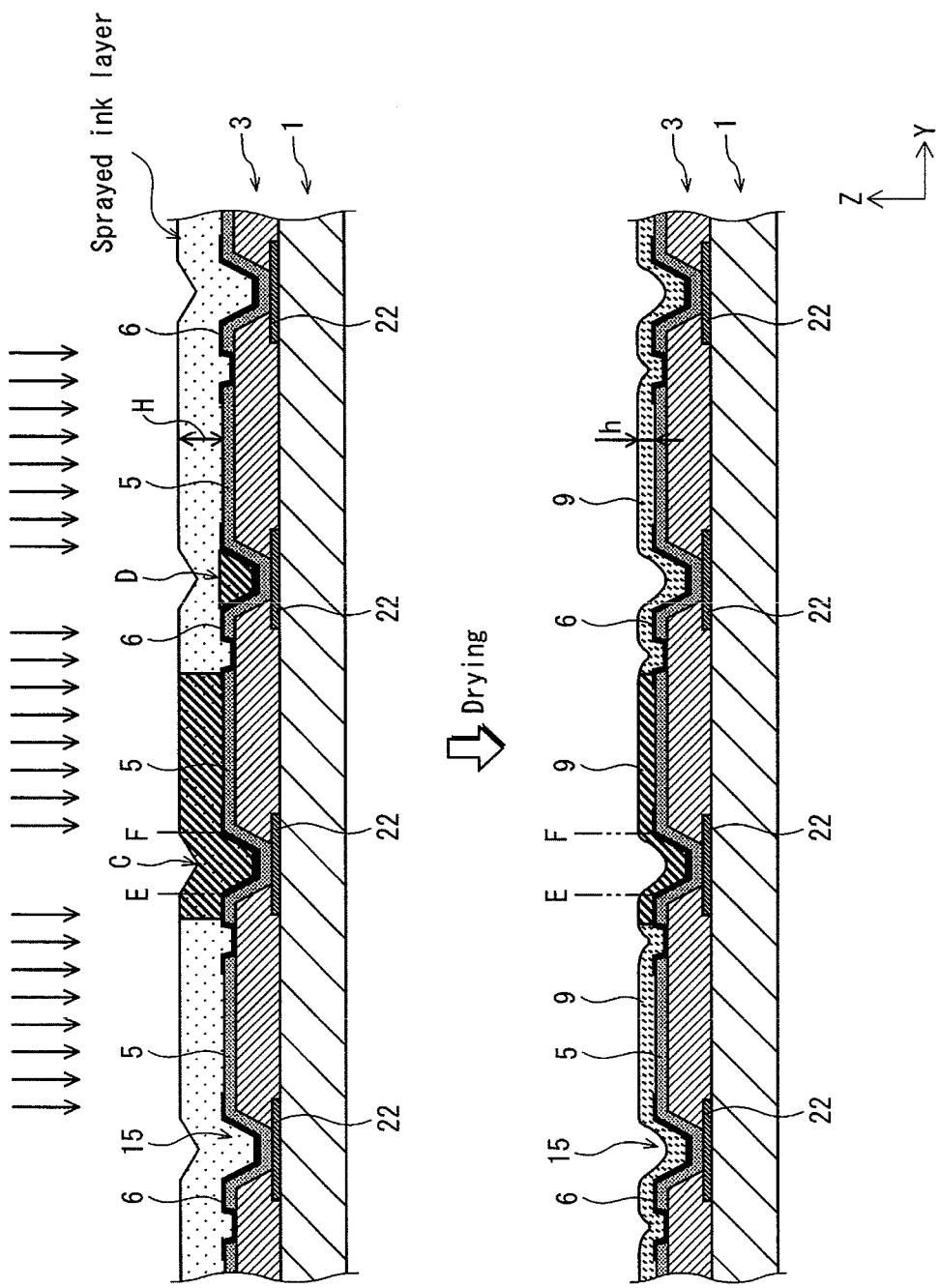

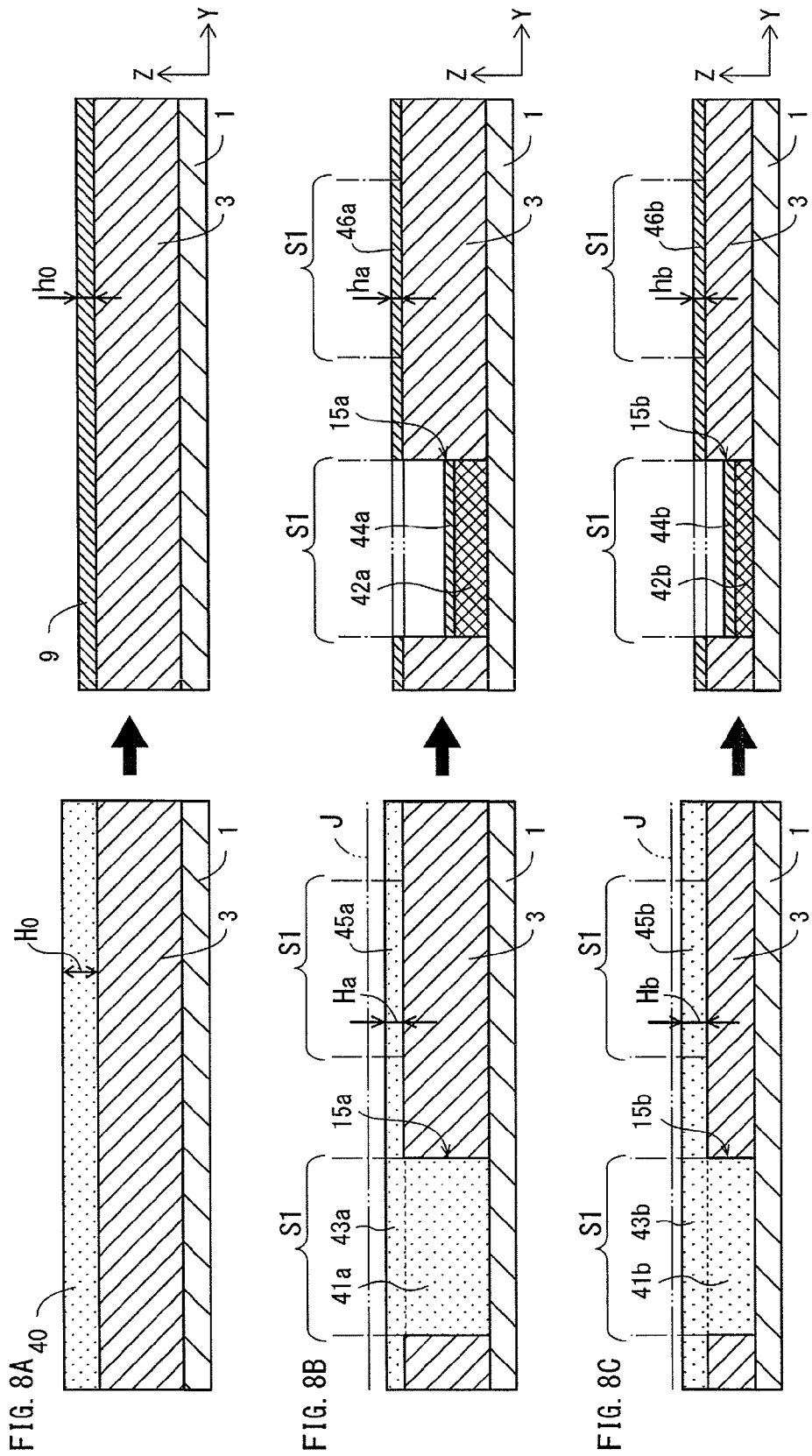

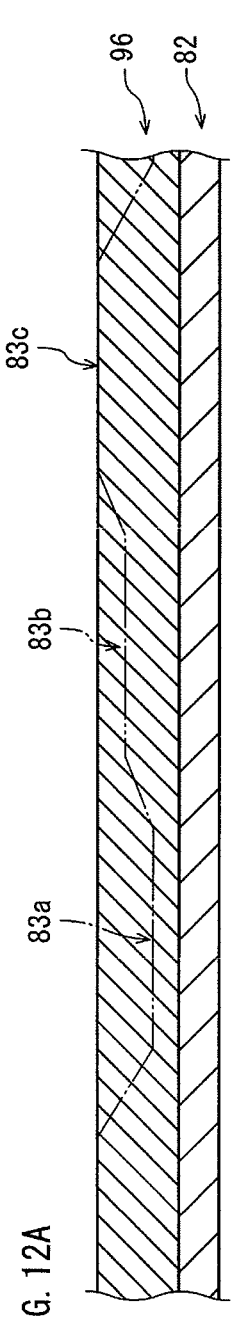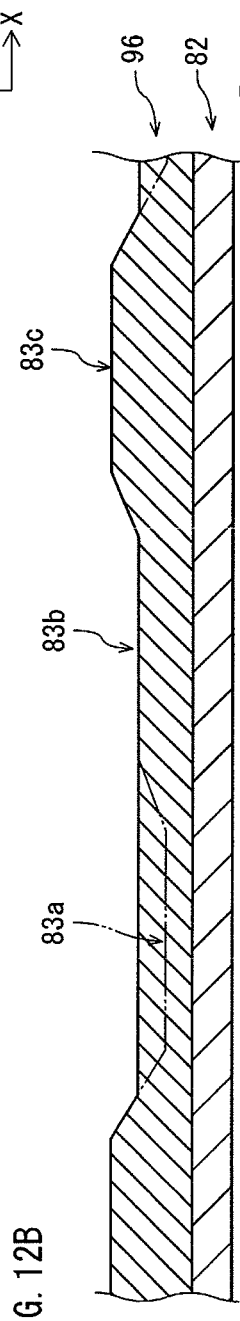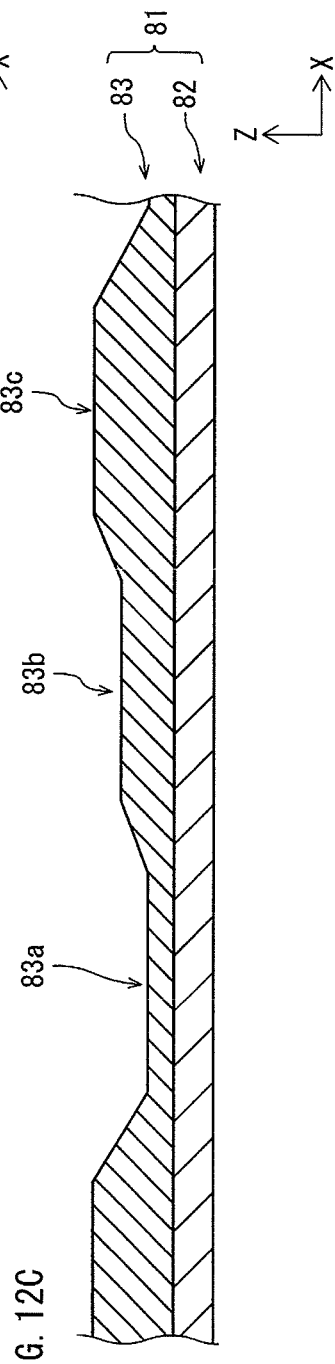

ORGANIC LIGHT-EMITTING DISPLAY PANEL, DISPLAY DEVICE, AND METHOD OF MANUFACTURING ORGANIC LIGHT-EMITTING DISPLAY PANEL

CROSS REFERENCE TO RELATED APPLICATION

This is a continuation application of PCT Application No. PCT/JP2010/004990 filed Aug. 6, 2010, designating the United States of America, the disclosure of which, including the specification, drawings and claims, is incorporated herein by reference in its entirety.

BACKGROUND OF THE INVENTION

1. Field of the Invention

The present invention relates to organic light-emitting display panels containing a matrix of organic light-emitting elements, to display devices, and to methods of manufacturing organic light-emitting display panels.

2. Description of the Related Art

In recent years, organic light-emitting display panels that have a plurality of organic light-emitting elements in rows above a substrate have been used as light-emitting display panels in compact electronic equipment and compact display devices. The basic structure of an organic light-emitting element is to form a light-emitting layer, which includes organic light-emitting material, between a pair of electrodes, i.e. an anode and a cathode. When voltage is applied between the pair of electrodes, holes injected into the light-emitting layer from the anode recombine with electrons injected into the light-emitting layer from the cathode, and as a result, the organic light-emitting element emits light. Since each organic light-emitting element in the organic light-emitting display panel emits light, the light from the display panel is highly visible.

In an organic light-emitting display panel, typically a light-emitting layer is partitioned in each organic light-emitting element by banks (walls) formed from insulating material. These banks define the shape of the light-emitting layer. Between the anode and the light-emitting layer, intermediate layers are provided as necessary, such as a hole-injection layer, hole transporting layer, hole injection and transporting layer, or an electron blocking layer. An electron injection layer, electron transport layer, or electron injection and transporting layer may also be provided between the cathode and the light-emitting layer as necessary.

In a full-color organic light-emitting display panel, such organic light-emitting elements are formed into sub-pixels whose color is R, G, or B. Three adjacent RGB sub-pixels together constitute one pixel.

In order to form the light-emitting layer or intermediate layers in each organic light-emitting element, banks are formed on the substrate to partition adjacent organic light-emitting elements. Subsequently, an inkjet or other wet method is generally used to spray ink containing high-molecular (polymer) material or low-molecular material suitable for thin-film formation. With such a wet method, it is relatively easy to form the intermediate layer or light-emitting layer even in large panels.

In an inkjet method (see Patent Literature 1), which is representative of wet methods, inkjet heads are moved across a substrate, on which ink is to be sprayed, in any direction of the matrix of elements while a solution (hereinafter simply "ink") is sprayed by ejecting drops of ink through each nozzle into regions defined by the banks on the substrate. The ink contains organic material and solvent that are for forming the intermediate layers, the light-emitting layer, etc.

3. Patent Literature

Patent Literature 1: Japanese Patent Application Publication No. 2003-241683

SUMMARY OF THE INVENTION

The film thickness of the intermediate layers that improves luminous efficiency of each organic light-emitting element depends on the wavelength of the luminescent color. For example, in a top-emission organic light-emitting element, it is preferable that optical path lengths be set so that reflected light and direct light strengthen each other. Reflect light refers to light that is emitted from the light-emitting layer towards the substrate and reflected by an electrode or the like near the substrate before exiting through the light-emitting layer. Conversely, direct light is emitted directly upwards (in the direction opposite the substrate) from the light-emitting layer.

The wavelengths of red, green, and blue light differ, causing the optimal optical path length (resonance condition) inside each organic light-emitting element to differ. Therefore, in order to improve luminous efficiency, it is preferable to finely adjust differences in film thickness of the intermediate layers in the sub-pixel of each luminescent color to match the wavelength of each color.

When the wet method is used to actually form the intermediate layers, however, it is difficult to finely adjust the film thickness of the intermediate layers for each color.

Specifically, the ink that includes material for the intermediate layers is set to be the same for all colors, and the amount of ink provided to each sub-pixel for forming the intermediate layers is set to be constant. For example, when spraying ink for the intermediate layers by the inkjet method, the number of drops of ink ejected into the regions for forming the organic light-emitting element of each color is set to be the same, and the volume of each drop of ink ejected from the nozzle is set to be the same.

It is plausible to adjust the film thickness of the intermediate layers by changing the number of drops of ink dripped into the sub-pixel of each color when using the inkjet method. Since the amount of ink provided to each sub-pixel can only be varied by changing the number of drops of ink, however, it is difficult with this approach to finely adjust the film thickness of the intermediate layers in the sub-pixel of each color.

Furthermore, since the appropriate film thickness of the light-emitting layer for achieving, for example, a desired brightness or chromaticity differs by color, there is a need to finely adjust the difference in film thickness between light-emitting layers of different colors. There is also a need to finely adjust the difference in film thickness in order for the optical path length to match the wavelength of the luminescent color, as is the case with the intermediate layers.

As is clear from the above examples, there is a need in organic light-emitting display panels to finely adjust the difference in film thickness between intermediate layers and light-emitting layers formed by the wet method.

The present invention has been conceived in light of the above problems, and it is an object thereof to make it easy to finely adjust differences in film thickness between intermediate layers, light-emitting layers, etc. of differing luminescent colors in an organic light-emitting display panel in which such layers are formed by the wet method, thereby improving luminous efficiency, luminescent color, etc.

In order to solve the above problems, an organic light-emitting display plan according to an aspect of the present invention comprises: a TFT layer; an interlayer insulation film provided above the TFT layer; a first electrode plate group formed in a line on the interlayer insulation film and including a plurality of first electrode plates corresponding to a first color; a second electrode plate group formed in a line on the interlayer insulation film adjacent to the first electrode plate group and including a plurality of second electrode plates corresponding to a second color; a first bank along a longitudinal first edge of the first electrode plate group; a second bank between a longitudinal second edge of the first electrode plate group and a longitudinal first edge of the second electrode plate group; a third bank along a longitudinal second edge of the second electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein the interlayer insulation film is provided with first contact holes, each connecting one of the first electrode plates with the TFT layer, and second contact holes, each connecting one of the second electrode plates with the TFT layer, each of the first electrode plates has a first concavity shaped in conformity with one of the first contact holes, and each of the second electrode plates has a second concavity shaped in conformity with one of the second contact holes, the interlayer insulation film is thicker at a location where the first electrode plate group is formed than at a location where the second electrode plate group is formed, any of the first contact holes has a greater depth and a larger volume than any of the second contact holes, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

A display device according to an aspect of the present invention comprises the above-described organic light-emitting display panel.

A method of manufacturing an organic light-emitting display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line and a second electrode plate group including a plurality of second electrode plates corresponding to a second color and arranged in a line; a fifth step of forming a first bank along a longitudinal first edge of the first electrode plate group, a second bank between a longitudinal second edge of the first electrode plate group and a longitudinal first edge of the second electrode plate group, and a third bank along a longitudinal second edge of the second electrode plate group; a sixth step of forming a continuous first organic functional layer between the first bank and the second bank and above the first electrode plate group; a seventh step of forming a continuous second organic functional layer between the second bank and the third bank and above the second electrode plate group; and an eighth step of disposing a counter electrode to cover both the first organic functional layer and the second organic functional layer, wherein in the third step, the interlayer insulation film is formed thicker at a location where the first electrode plate group is formed than at a location where the second electrode plate group is formed, and the interlayer insulation film is provided with first contact holes, each connecting one of the first electrode plates with the TFT layer, and second contact holes, each connecting one of the second electrode plates with the TFT layer, any of the first contact holes having a greater depth and a larger volume than any of the second contact holes, in the fourth step, each of the first electrode plates is formed to have a first concavity shaped in conformity with one of the first contact holes, and each of the second electrode plates is formed to have a second concavity shaped in conformity with one of the second contact holes, and in the first organic functional layer formed in the sixth step and the second organic functional layer formed in the seventh step, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

An organic light-emitting display panel according to an aspect of the present invention allows the depth of each first contact hole and each second contact hole to be changed by varying the thickness of the interlayer insulation film, thus making it easy to increase the volume of each first contact hole with respect to the volume of each second contact hole.

Accordingly, the volume of the first concavity increases with respect to the volume of the second concavity. During formation of an organic functional layer by the wet method, if for example a first organic functional layer and a second organic functional layer formed above electrode plates have the same volume, then an amount of the first organic functional layer that enters into the first concavity is made larger than an amount of the second organic functional layer that enters into the second concavity. As a result, if for example organic functional layers having the same volume are respectively formed above first electrode plates corresponding to a first color and second electrode plates corresponding to a second color, the film thickness of the first organic functional layer corresponding to a region other than the first concavity (for example, a level region) in the first electrode plates is made less than the film thickness of the second organic functional layer corresponding to a region other than the second concavity in the second electrode plates (hereinafter, the former film thickness is simply referred to as the "film thickness of the first organic functional layer", and the latter film thickness as the "film thickness of the second organic functional layer").

The difference between the volume of the first concavity and the volume of the second concavity can be adjusted in smaller increments than the volume of one drop of ink sprayed from a nozzle by the inkjet method. Therefore, finely adjusting the difference between the volume of the first concavity and the volume of the second concavity makes it easy to finely adjust the difference between the film thickness of the first organic functional layer and the film thickness of the second organic functional layer.

This facilitates finely adjusting the difference in film thickness between organic functional layers corresponding to different colors. As a result, it is possible, for example, to appropriately adjust the resonance conditions of light in the organic light-emitting element of each color, making it easy to achieve a display panel with excellent luminous efficiency.

Note that, in order to appropriately adjust the resonance conditions of light in the organic light-emitting element of each color, it is not necessary to adjust the optical path length only by varying the organic functional layer. The film thickness of other layers (such as a transparent electrode layer) may also be adjusted by color.

So that "the interlayer insulation film is formed thicker at a location where the first electrode plate group is formed than at a location where the second electrode plate group is formed", at least one of an upper surface and a lower surface of the interlayer insulation film may be changed at the location where the first electrode plate group is formed and at the location where the second electrode plate group is formed (details provided below).

With the method of manufacturing an organic light-emitting display panel according to an aspect of the present invention, the above organic light-emitting display panel can be manufactured.

BRIEF DESCRIPTION OF THE DRAWINGS

FIG. 3A is a plan view showing the structure of the display panel 100, FIG. 3B is a cross-section diagram from A to A' in FIG. 3A, and FIG. 3C is a cross-section diagram from B to B' in FIG. 3A;

FIGS. 4A-4G are an illustration of a method of manufacturing the display panel 100;

FIGS. 5A and 5B are schematic diagrams illustrating a formation process of an interlayer insulation film in the display panel 100;

FIGS. 6A and 6B are schematic diagrams illustrating a formation process of banks in the display panel 100;

FIG. 7 is a schematic cross-section diagram showing conditions immediately after spraying ink for forming an intermediate layer on a substrate and after drying the ink;

FIGS. 8A-8C are schematic diagrams illustrating the relationship between the volume of a concavity 15 and the film thickness of an intermediate layer 9;

FIGS. 12A-12C are schematic diagrams illustrating a formation process of a stepped substrate 81 according to Embodiment 2;

DESCRIPTION OF THE PREFERRED EMBODIMENT(S)

Figure 1:
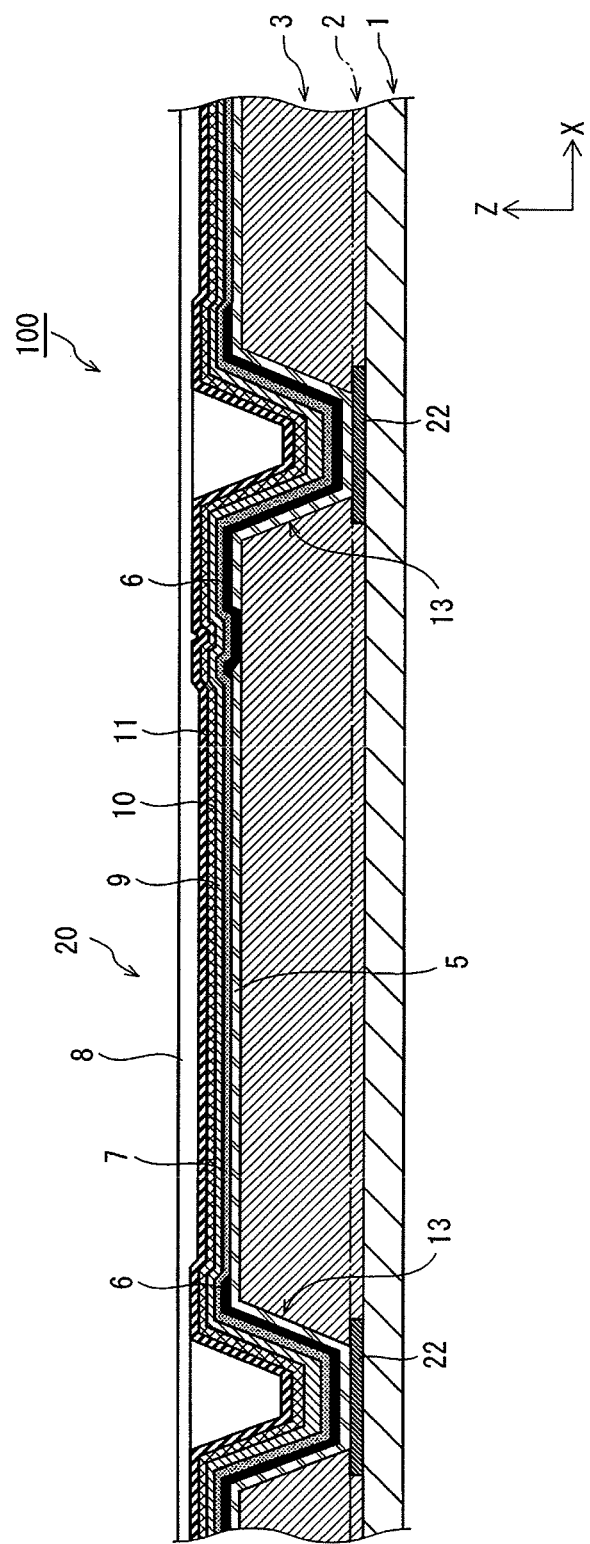
FIG. 1 is a cross-section diagram schematically showing the structure of an organic light-emitting display panel 100 according to Embodiment 1.

An organic light-emitting display panel according to an aspect of the present invention comprises: a TFT layer; an interlayer insulation film provided above the TFT layer; a first electrode plate group formed in a line on the interlayer insulation film and including a plurality of first electrode plates corresponding to a first color; a second electrode plate group formed in a line on the interlayer insulation film adjacent to the first electrode plate group and including a plurality of second electrode plates corresponding to a second color; a first bank along a longitudinal first edge of the first electrode plate group; a second bank between a longitudinal second edge of the first electrode plate group and a longitudinal first edge of the second electrode plate group; a third bank along a longitudinal second edge of the second electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein the interlayer insulation film is provided with first contact holes, each connecting one of the first electrode plates with the TFT layer, and second contact holes, each connecting one of the second electrode plates with the TFT layer, each of the first electrode plates has a first concavity shaped in conformity with one of the first contact holes, and each of the second electrode plates has a second concavity shaped in conformity with one of the second contact holes, the interlayer insulation film is thicker at a location where the first electrode plate group is formed than at a location where the second electrode plate group is formed, any of the first contact holes has a greater depth and a larger volume than any of the second contact holes, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

An organic light-emitting display panel according to an aspect of the present invention allows the depth of each first contact hole and each second contact hole to be changed by varying the thickness of the interlayer insulation film, thus making it easy to increase the volume of each first contact hole with respect to the volume of each second contact hole.

Accordingly, the volume of the first concavity increases with respect to the volume of the second concavity. During formation of an organic functional layer by the wet method, if for example a first organic functional layer and a second organic functional layer formed above electrode plates have the same volume, then an amount of the first organic functional layer that enters into the first concavity is made larger than an amount of the second organic functional layer that enters into the second concavity. As a result, if for example organic functional layers having the same volume are respectively formed above first electrode plates corresponding to a first color and second electrode plates corresponding to a second color, the film thickness of the first organic functional layer corresponding to a region other than the first concavity (for example, a level region, a light-emitting region, etc.) in the first electrode plates is made less than the film thickness of the second organic functional layer corresponding to a region other than the second concavity in the second electrode plates.

The difference between the volume of the first concavity and the volume of the second concavity can be adjusted in smaller increments than the volume of one drop of ink sprayed from a nozzle by the inkjet method. Therefore, finely adjusting the difference between the volume of the first concavity and the volume of the second concavity makes it easy to finely adjust the difference between the film thickness of the first organic functional layer and the film thickness of the second organic functional layer.

This facilitates finely adjusting the difference in film thickness between organic functional layers corresponding to different colors. As a result, it is possible, for example, to appropriately adjust the resonance conditions of light in the organic light-emitting element of each color, making it easy to achieve a display panel with excellent luminous efficiency.

Note that, in order to appropriately adjust the resonance conditions of light in the organic light-emitting element of each color, it is not necessary to adjust the optical path length exclusively by varying the organic functional layer. The film thickness of other layers (such as a transparent electrode layer) may also be adjusted by color.

In this context, appropriate adjustment of the resonance conditions of light in the organic light-emitting elements refers, for example, to the following. If an organic light-emitting display panel is manufactured under the same conditions as the organic light-emitting display panel in the present aspect (dimensions of organic light-emitting elements, amount of sprayed ink, etc.), except with the same volume for the first and second contact holes, the luminous efficiency of the organic light-emitting elements of both the first color and the second color cannot be improved simultaneously. The luminous efficiency of the organic light-emitting elements of both colors can, however, be improved by varying the volume of the first and second contact holes.

The following examples show how the organic light-emitting elements of both the first color and the second color cannot be improved simultaneously when the first and second contact holes have the same volume. If the volume of the first contact hole in the organic light-emitting display panel of the present aspect is decreased to match the volume of the second contact hole, the luminous efficiency of the organic light-emitting element of the first color decreases. Conversely, if the volume of the second contact hole is increased to match the volume of the first contact hole, the luminous efficiency of the organic light-emitting element of the second color decreases.

The same can be said when appropriately adjusting the luminescent color of the organic light-emitting elements of each color. Note that each luminescent color is appropriately adjusted by, for example, improving the color purity of the luminescent color.

The above "volume of the first contact hole" may be substituted by the "volume of the first concavity", and the above "volume of the second contact hole" may be substituted by the "volume of the second concavity".

So that "the interlayer insulation film is formed thicker at a location where the first electrode plate group is formed than at a location where the second electrode plate group is formed", at least one of an upper surface and a lower surface of the interlayer insulation film may be changed at the location where the first electrode plate group is formed and at the location where the second electrode plate group is formed.

In order to change the height of the upper surface of the interlayer insulation film, for example, steps may be formed on the upper surface of the interlayer insulation film so that the location where the first electrode plate group is formed becomes higher than the location where the second electrode plate group is formed.

In order to change the height of the lower surface of the interlayer insulation film, for example, a location of the TFT layer corresponding to the first electrode plate group may be made lower than a location corresponding to the second electrode plate group.

Note that in the present aspect, for example, a substrate in which a location corresponding to the first electrode plate group is lower than a location corresponding to the second electrode plate group may be provided, and the TFT layer formed on the substrate.

In this context, stating that "the volume of a portion of the first organic functional layer above any of the first electrode plates is equal to, or an approximation of, the volume of a portion of the second organic functional layer above any of the second electrode plates" refers to the volume of the first organic functional layer and the volume of the second organic functional layer being substantially equal (within tolerance range). Numerically speaking, the difference in volume between the first and second organic functional layers is within a range of 10%, inclusive, of the volume of the first organic functional layer.

In the present aspect, the difference between the volume of the first concavity and the volume of the second concavity may be larger than the volume of a drop of ink (for example, 1.5 times the volume of the drop).

Note that it is preferable that the difference between the volume of the first organic functional layer and the volume of the second organic functional layer be less than the volume of the first organic functional layer that accumulates in the first concavity minus the volume of the second organic functional layer that accumulates in the second concavity.

In this context, "a region other than the first concavity in any of the first electrode plates" refers, for example, to level regions in the first electrode plates, in plan view, excluding the region where the first concavity is formed (which may include a region surrounding the first concavity). Specifically, this region may, for example, be located in the light-emitting region in plan view. The same is true for the region above any of the second electrode plates.

In the present aspect, "above" refers to being farther away from the TFT layer in the direction of lamination of the organic functional layer and other layers.

Note that even if layers other than the organic functional layer (such as a pixel defining layer) are formed on the electrode plates, the difference in film thickness between organic functional layers can be finely adjusted if the other layers enter into and adopt the shape of the concavity.

In the organic light-emitting display panel according to the above aspect of the present invention, a size of an upper opening of each of the first contact holes may be equal to, or an approximation of, a size of an upper opening of each of the second contact holes.

With the above structure, even if the size of the upper opening of the first contact hole and the size of the upper opening of the second contact hole are equal, or an approximation of each other, the volume of the first contact hole is made larger than the volume of the second contact hole by changing the depth of the first and second contact holes. As a result, the difference between the film thickness of the first organic functional layer and the film thickness of the second organic functional layer is finely adjusted.

Furthermore, by making the size of the upper opening of the first and second contact holes substantially equal, the area of the opening of the first and second concavities becomes substantially equal. This allows the sprayed ink to enter into the concavities with roughly equal ease.

Note that the size of the upper opening may be considered to be the area of the opening of the contact hole at the upper surface of the interlayer insulation film, or the area of the opening of the contact hole in a cross-section of an upper part of the contact hole, cut perpendicular to the direction of lamination of the organic functional layer and other layers. The upper part of the contact hole refers, for example, to any position between the highest part of the periphery of the contact hole and a position 15% lower than the highest part in terms of the depth of the contact hole.

"Equal to, or an approximation of" refers to the size of the upper opening of the first contact hole and the size of the upper opening of the second contact hole being substantially equal (within tolerance range). Numerically speaking, this means that the difference between the size of the upper opening of the first contact hole and the size of the upper opening of the second contact hole is within 10%, inclusive, of the size of the upper opening of the first contact hole.

In the organic light-emitting display panel according to the above aspect of the present invention, the size of the upper opening of any contact hole may be the area of a circle defined by a diameter of the contact hole at a position 10%, or an approximation of 10%, lower than a height of a highest position of the interlayer insulation film along a periphery of the contact hole.

With the above structure, the contact hole is a circle in plan view, with the size of the upper opening being defined by a diameter of the contact hole at a position 10%, or an approximation of 10%, lower than a highest position of the periphery of the contact hole. Accordingly, if the shape or the height of the contact hole is irregular at or near the highest position of the periphery of the contact hole, the effect of such irregularity is reduced. Note that an approximation of 10% refers to being within tolerance range, and may for example be a range between 9% and 11%.

The organic light-emitting display panel according to the above aspect of the present invention may further comprise a first pixel defining layer covering the first concavity, the first organic functional layer being formed above the first pixel defining layer; and a second pixel defining layer covering the second concavity, the second organic functional layer being formed above the second pixel defining layer.

With the above structure, a pixel defining layer that has insulating properties covers the concavity, thereby electrically insulating the concavity and the organic functional layer. This prevents a local concentration of current from causing the organic light-emitting layer to emit light at a different brightness by, for example, the rim of the concavity than in a region near the concavity.

The first pixel defining layer and second pixel defining layer are formed, for example, from an oxide (including a nitride) such as a film of silicon oxide (SiO), silicon nitride (SiN), silicon oxynitride (SiON), etc. The first organic functional layer and the second organic functional layer have high wettability with respect to the oxide or nitride, such as a SiO film or a SiN film. When ink including material for the organic functional layers is sprayed directly on the pixel defining layers, the first and second organic functional layers easily enter the first and second concavities respectively.

This is even more advantageous for finely adjusting the difference in film thickness between organic functional layers corresponding to different colors.

In the organic light-emitting display panel according to the above aspect of the present invention, the first organic functional layer may be continuous above the first electrode plate group due to ink drops of a predetermined volume being sprayed via an inkjet method, the second organic functional layer may be continuous above the second electrode plate group due to ink drops of the predetermined volume, or an approximation of the predetermined volume, being sprayed via the inkjet method, and the volume of the portion of the first organic functional layer above any of the first electrode plates may be equal to, or an approximation of, the volume of the portion of the second organic functional layer above any of the second electrode plates.

With the above structure, when the organic functional layers are formed, the volume of ink drops sprayed by the inkjet method are substantially equal (for example, the difference in volumes being within a tolerance range of 10%) when forming both the first and the second organic functional layers. Furthermore, the volume of the first organic functional layer and the volume of the second organic functional layer are equal, or an approximation of each other (for example, the difference in volumes being within a tolerance range of 10%), and the number of drops sprayed in a region above each electrode plate is the same.

As described above, since the volume of each first contact hole is larger than the volume of each second contact hole, the film thickness of the first organic functional layer in a region other than the first concavity in any of the first electrode plates is less than the film thickness of the second organic functional layer in a region other than the second concavity in any of the second electrode plates.

With the above structure, therefore, the same spraying conditions for each color are maintained when using the inkjet method, which simplifies both manufacturing equipment and the manufacturing process. Furthermore, since the volume of the first contact hole is larger than the volume of the second contact hole, the film thickness of the first organic functional layer is less than the film thickness of the second organic functional layer. In other words, the difference in film thickness between organic functional layers corresponding to different colors is finely adjusted.

Conventionally, when forming an organic functional layer of an organic light-emitting element by the inkjet method, the number of shots of the inkjet apparatus (for example, the number of ink drops per sub-pixel) is adjusted for each color, R, G, and B, to adjust the film thickness of each organic functional layer. As a result, it is difficult to finely adjust the film thickness. For example, if 10 drops of organic ink for forming the organic functional layer are dripped into a region corresponding to an electrode plate of a first color, the film thickness increases by 1.1 times (approximately 10%) if the number of shots is changed to 11 drops. In other words, film thickness cannot be varied by less than 10% with such an inkjet apparatus. Accordingly, the difference in film thickness between organic functional layers corresponding to different colors cannot be finely adjusted.

When the organic functional layer is a hole transporting layer or an electron blocking layer, the same material is used in each color, R, G, and B. In this case, to adjust the difference in film thickness between organic functional layers corresponding to different colors, it becomes necessary to control the number of shots from R, G, and B nozzles in the inkjet apparatus, thus complicating the apparatus.

By contrast, with the above structure the volume of the first organic functional layer and the volume of the second organic functional layer are substantially equal. The difference in volume between contact holes can be set, for example, to 1.5 times the amount of an ink drop, so as to finely adjust the film thickness between organic functional layers even when the number of shots is the same for each color. In other words, with the above structure, the film thickness corresponding to each luminescent color, R, G, and B, can be finely adjusted at will, even when the inkjet apparatus sprays the same amount of ink when forming the organic functional layer for each color.

Moreover, the inkjet apparatus sprays ink corresponding to each luminescent color from all of the nozzles under the same spraying conditions. This renders it unnecessary to control the nozzles corresponding to each luminescent color in the inkjet apparatus, thereby simplifying control of the apparatus.

As a result, the film thickness of the organic functional layers is finely adjusted by adjusting the volume of the concavities, while maintaining the volume of a portion of the first organic functional layer above any of the first electrode plates equal to, or an approximation of, the volume of a portion of the second organic functional layer above any of the second electrode plates.

In the organic light-emitting display panel according to the above aspect of the present invention, a difference between the film thickness of the first organic functional layer and the film thickness of the second organic functional layer may be larger than an additional film thickness of the first organic functional layer when a number of ink drops of the predetermined volume sprayed on each of the first electrode plates via the inkjet method is increased by n drops, and smaller than an additional film thickness of the first organic functional layer when the number of ink drops is increased by n+1 drops.

With the above structure, the difference between the film thickness of the first organic functional layer in a region other than the first concavity in any of the first electrode plates and the film thickness of the second organic functional layer in a region other than the second concavity in any of the second electrode plates is finely adjusted in increments that are smaller than the film thickness of a layer formed by one ink drop, the smallest unit for spraying by the nozzles of the inkjet apparatus (for example, in increments of one half of an ink drop). Note that n is an integer greater than or equal to zero ($n \geq 0$).

The additional film thickness of the first organic functional layer when the number of ink drops is increased by n drops may be the increase in the film thickness of the first to organic functional layer due to n ink drops. Similarly, the additional film thickness of the first organic functional layer when the number of ink drops is increased by n+1 drops may be the increase in the film thickness of the first organic functional layer due to n+1 ink drops.

In the organic light-emitting display panel according to the above aspect of the present invention, the first color may be blue.

Organic light-emitting elements may adopt a cavity structure, in which for example the optical path length of reflected light, which is emitted at the side of the counter electrode after being reflected at the side of the electrode plate, is matched to the wavelength of each color of light, so that the reflected light interferes with and strengthens direct light emitted from the light-emitting layer at the side of the counter electrode. When the organic functional layer forms part of this cavity structure, it is preferable for the film thickness of the blue organic functional layer to be made thin. This is because, among the wavelengths of red (R), green (G), and blue (B) light, the wavelength of blue light is the shortest, making it preferable for the corresponding optical path length to be the shortest.

With the above structure, the first color is blue. Therefore, the film thickness of the blue organic functional layer is made less than the organic functional layers of other luminescent colors. This yields, for example, organic light-emitting elements of various colors with excellent light-extraction efficiency (light-extraction efficiency referring to the ratio of the number of photons exiting the organic light-emitting element to the number of photons produced within the organic light-emitting element).

In the organic light-emitting display panel according to the above aspect of the present invention, an upper surface of the interlayer insulation film may be higher at a location where the first electrode plate group is formed than at a location where the second electrode plate group is formed, and a height of the TFT layer at a location corresponding to a bottom of the first contact hole may be equal to, or an approximation of, a height of the TFT layer at a location corresponding to a bottom of the second contact hole.

With the above structure, steps are formed on the upper surface of the interlayer insulation film. In other words, differences in height are provided. As a result, even if the height of the portions of the TFT layer corresponding to the first contact holes is equal to, or an approximation of, the height of the portions corresponding to the second contact holes, the depth of the contact holes is varied. This makes it easy to finely adjust the difference in volume between contact holes.

Electrodes (the Source-Drain (SD) electrodes in the Embodiments) for providing power from the TFTs to the electrode plates are provided on the TFT layer, and the contact holes are formed above the electrodes. A portion of each electrode plate enters into the contact hole forming a concavity. The bottom wall of the concavity is in surface contact with the upper surface of one of the electrodes, thus bringing the electrode plate and the electrode into conduction. In this case, the height of a location in the TFT layer corresponding to the bottom of the first (or second) contact hole can be considered the height of the upper surface of the electrode for supplying power.

Stating that locations corresponding to the bottom of the contact holes are formed to an equal height, or an approximation of an equal height, means that the heights are substantially equal. For example, the difference in height may be set to within 5% of the difference between the depth of the first contact hole and the depth of the second contact hole.

Generally, in this context, the heights of locations in the TFT layer corresponding to the bottom of the first and second contact holes are substantially equal. Therefore, the above structure is compatible with a typical TFT layer and thus is extremely versatile.

In the organic light-emitting display panel according to the above aspect of the present invention, a height of an upper surface of the interlayer insulation film at a location where the first electrode plate group is formed may be equal to, or an approximation of, a height of the upper surface of the interlayer insulation film at a location where the second electrode plate group is formed, and the TFT layer may be lower at a location corresponding to a bottom of the first contact hole than at a location corresponding to a bottom of the second contact hole.

With the above structure, differences in height in the TFT layer are provided without differences in height, in the upper surface of the interlayer insulation film, between locations where the first electrode plate group is formed and locations where the second electrode plate group is formed. As a result, the depth of the contact holes is varied, even though the height, in the upper surface of the interlayer insulation film, of locations where the first electrode plate group is formed is substantially equal to the height in locations where the second electrode plate group is formed. This makes it easy to finely adjust the difference in volume between contact holes.

Stating that the height, in the upper surface of the interlayer insulation film, of locations where the first electrode plate group is formed is equal to the height in locations where the second electrode plate group is formed means that the heights are at least substantially equal. Substantially equal may be defined, for example, as above, i.e. within 5% of the difference between the depth of the first contact hole and the depth of the second contact hole.

The above structure has the advantage that, since there is no difference in height, in the upper surface of the interlayer insulation film, between locations where the first electrode plate group is formed and locations where the second electrode plate group is formed, it is easy to form organic light-emitting elements on the interlayer insulation film.

The organic light-emitting display panel according to the above aspect of the present invention, may further comprise: a third electrode plate group adjacent to the second electrode plate group and including a plurality of third electrode plates corresponding to a third color and arranged in a line; a fourth bank along a longitudinal edge of the third electrode plate group opposite the second electrode plate group; and a third organic functional layer between the third bank and the fourth bank and above the third electrode plate group; wherein the counter electrode is provided above the third organic functional layer, the interlayer insulation film is provided with third contact holes, each connecting one of the third electrode plates with the TFT layer, each of the third electrode plates has a third concavity shaped in conformity with one of the third contact holes, the interlayer insulation film is thicker at a location where the first electrode plate group is formed than at a location where the third electrode plate group is formed, any of the first contact holes has a greater depth and a larger volume than any of the third contact holes, the volume of a portion of the first organic functional layer above any of the first electrode plates is equal to, or an approximation of, the volume of a portion of the third organic functional layer above any of the third electrode plates, and an amount of the first organic functional layer that has entered into the first concavity is larger than an amount of the third organic functional layer that has entered into the third concavity, so that a film thickness of the first organic functional layer in a region other than the first concavity in any of the first electrode plates is less than a film thickness of the third organic functional layer in a region other than the third concavity in any of the third electrode plates.

With the above structure, an organic light-emitting element corresponding to the third electrode plate group is provided in addition to the organic light-emitting elements corresponding to the first and second electrode plate groups. This achieves an organic light-emitting display panel that displays images in three luminescent colors. Setting the three colors to be red, green, and blue (RGB) yields an extremely versatile organic light-emitting display panel.

With the above structure, setting the volume of the third contact hole to be different from the volume of the second contact hole allows for the volume of the contact hole to be different for each color, R, G; and B. In the sub-pixel of each color, R, and B, the above cavity structure is normally adopted in order to improve light-extraction efficiency. In this case, it is preferable to finely adjust the difference in film thickness between organic functional layers to yield an optical path length that optimally matches the wavelength of each color, R, G; and B.

With the above structure, it is relatively easy to finely adjust the difference in volume between contact holes via the film thickness of the interlayer insulation film and the shape of the contact holes (size of the upper opening, etc.). This makes it possible to finely adjust the difference in film thickness between functional organic layers.

Therefore, when the organic functional layers are formed by the inkjet method, the difference in film thickness between the organic functional layers that appropriately adjusts the cavity in each sub-pixel is finely adjusted by changing the volume of the contact holes formed for each color, R, G, and B.

In particular, the volume of the contact holes can be made smaller in order from B to G to R (B>G>R) in order to appropriately adjust the cavity corresponding to the emission wavelength of each color, R, G, and B. By doing so, the film thickness of the organic functional layers can be made to increase from B to G to R (B<G<R). Note that since layers other than the organic functional layer are included in the cavity, the film thickness of the organic functional layer corresponding to each color, R, G, and B, may be varied via the film thickness of such other layers.

In the organic light-emitting display panel according to the above aspect of the present invention, a size of an upper opening of each of the first contact holes, a size of an upper opening of each of the second contact holes, and a size of an upper opening of each of the third contact holes may be equal to, or an approximation of, each other.

With the above structure, even when the size of the upper opening of the contact holes for each color is substantially equal, the film thickness of the organic functional layers is finely adjusted via the shape of the contact holes.

In the organic light-emitting display panel according to the above aspect of the present invention, the size of the upper opening of any contact hole may be the area of a circle defined by a diameter of the contact hole at a position 10%, or an approximation of 10%, lower than a height of a highest position of the interlayer insulation film along a periphery of the contact hole.

In the organic light-emitting display panel according to the above aspect of the present invention, an upper surface of the interlayer insulation film may be higher at a location where the first electrode plate group is formed than at both a location where the second electrode plate group is formed and a location where the third electrode plate group is formed, and a height of the TFT layer at a location corresponding to a bottom of the first contact hole, a height of the TFT layer at a location corresponding to a bottom of the second contact hole, and a height of the TFT layer at a location corresponding to a bottom of the third contact hole may be equal to, or an approximation of, each other.

With the above structure, steps are formed on the upper surface of the interlayer insulation film. In other words, differences in height are provided. As a result, even if the heights of the portions of the TFT layer corresponding to the first, second, and third contact holes are equal to, or an approximation of, each other, the depth of the contact holes is varied. This makes it easy to finely adjust the difference in volume between contact holes.

Generally, in this context, the heights of locations in the TFT layer corresponding to the bottom of the first, second, and third contact holes are substantially equal. Therefore, the above structure is compatible with a typical TFT layer and thus is extremely versatile.

Note that stating that the heights of locations corresponding to the bottom of the contact holes are equal to, or an approximation, each other means that the heights to which the bottom of the contact holes are formed are at least substantially equal. The difference in height may be defined, for example, as being within 5% of the difference between the depth of the first contact hole and the depth of the shallower of the second and third contact holes.

In the organic light-emitting display panel according to the above aspect of the present invention, a height of an upper surface of the interlayer insulation film at a location where the first electrode plate group is formed, a height of the upper surface of the interlayer insulation film at a location where the second electrode plate group is formed, and a height of the upper surface of the interlayer insulation film at a location where the third electrode plate group is formed may be equal to, or an approximation of, each other, and the TFT layer may be lower at a location corresponding to a bottom of the first contact hole than at both a location corresponding to a bottom of the second contact hole and a location corresponding to a bottom of the third contact hole.

With the above structure, differences in height are provided in the TFT layer. As a result, the depth of the contact holes is varied, even if the height, in the upper surface of the interlayer insulation film, of locations where the first electrode plate group is formed is substantially equal to the height in locations where the second and third electrode plate groups are faulted. This makes it easy to finely adjust the difference in volume between contact holes.

The above structure has the advantage that, since there is no difference in height, in the upper surface of the interlayer insulation film, between locations where the first electrode plate group is formed and locations where the second and third electrode plate groups are formed, it is easy to form organic light-emitting elements on the interlayer insulation film.

Stating that the heights of locations where the first, second, and third electrode plate groups are substantially equal may be defined, for example, as above, i.e. by setting the difference in heights of locations corresponding to the bottom of the contact holes to be within 5% of the difference the depth of the first contact hole and the depth of the shallower of the second and third contact holes.

In the organic light-emitting display panel according to the above aspect of the present invention, the first organic functional layer and the second organic functional layer may be both one of a charge injection layer and a charge transport layer, a first organic light-emitting layer may be formed between the first organic functional layer and the counter electrode, and a second organic light-emitting layer may be formed between the second organic functional layer and the counter electrode.

The film thickness of the charge injection layer, charge transport layer, etc. is often less than the organic light-emitting layer, making it difficult to finely adjust the difference in film thickness between these layers. Therefore, it is highly advantageous to finely adjust the difference in film thickness via a difference in volume between contact holes.

In the organic light-emitting display panel according to the above aspect of the present invention, the first organic functional layer, the second organic functional layer, and the third organic functional layer may all be one of a charge injection layer and a charge transport layer, a first organic light-emitting layer may be formed between the first organic functional layer and the counter electrode, a second organic light-emitting layer may be formed between the second organic functional layer and the counter electrode, and a third organic light-emitting layer may be formed between the third organic functional layer and the counter electrode.

In the organic light-emitting display panel according to the above aspect of the present invention, the first organic functional layer and the second organic functional layer may each be an organic light-emitting layer.

With the above structure, the difference in film thickness between organic light-emitting layers corresponding to the various colors is finely adjusted by making the volume of the first contact hole larger than the volume of the second contact hole. This results in more suitable chromaticity, brightness, etc. for the organic light-emitting layers. Alternatively, the light-extraction efficiency may be improved.

In the organic light-emitting display panel according to the above aspect of the present invention, the first organic functional layer, the second organic functional layer, and the third organic functional layer may each be an organic light-emitting layer.

In the organic light-emitting display panel according to the above aspect of the present invention, the electrode plates may be anodes, and the counter electrode may be a cathode.

In the organic light-emitting display panel according to the above aspect of the present invention, the electrode plates may be cathodes, and the counter electrode may be an anode.

A display device according to an aspect of the present invention includes the organic light-emitting display panel according to the above aspect of the present invention.

The above structure achieves a display device provided with an organic light-emitting display panel according to the above aspect of the present invention.

A method of manufacturing an organic light-emitting display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line and a second electrode plate group including a plurality of second electrode plates corresponding to a second color and arranged in a line; a fifth step of forming a first bank along a longitudinal first edge of the first electrode plate group, a second bank between a longitudinal second edge of the first electrode plate group and a longitudinal first edge of the second electrode plate group, and a third bank along a longitudinal second edge of the second electrode plate group; a sixth step of forming a continuous first organic functional layer between the first bank and the second bank and above the first electrode plate group; a seventh step of forming a continuous second organic functional layer between the second bank and the third bank and above the second electrode plate group; and an eighth step of disposing a counter electrode to cover both the first organic functional layer and the second organic functional layer, wherein in the third step, the interlayer insulation film is formed thicker at a location where the first electrode plate group is formed than at a location where the second electrode plate group is formed, and the interlayer insulation film is provided with first contact holes, each connecting one of the first electrode plates with the TFT layer, and second contact holes, each connecting one of the second electrode plates with the TFT layer, any of the first contact holes having a greater depth and a larger volume than any of the second contact holes, in the fourth step, each of the first electrode plates is formed to have a first concavity shaped in conformity with one of the first contact holes, and each of the second electrode plates is formed to have a second concavity shaped in conformity with one of the second contact holes, and in the first organic functional layer formed in the sixth step and the second organic functional layer formed in the seventh step, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

The above structure allows for manufacturing of an organic light-emitting display panel according to the above aspect of the present invention. Accordingly, for example, the difference in the volume of the first contact hole and the second contact hole is finely adjusted by varying the thickness of the interlayer insulation film, thereby finely adjusting the difference between the film thickness of the first organic functional layer and the film thickness of the second organic functional layer. As a result, it is possible, for example, to appropriately adjust the resonance conditions of light in the organic light-emitting element of each color, making it easy to achieve a display panel with excellent luminous efficiency.

So that "the interlayer insulation film is formed thicker at a location where the first electrode plate group is formed than at a location where the second electrode plate group is formed", at least one of an upper surface and a lower surface of the interlayer insulation film may be changed at the location where the first electrode plate group is formed and at the location where the second electrode plate group is formed.

In order to change the height of the upper surface of the interlayer insulation film, for example, in the third step, steps may be formed on the upper surface of the interlayer insulation film by photolithography or the like, so that the location where the first electrode plate group is formed becomes higher than the location where the second electrode plate group is formed.

In order to change the height of the lower surface of the interlayer insulation film, for example, between the first step and the second step, steps may be formed on the substrate, so that a location of the TFT layer corresponding to the first electrode plate group is made lower than a location corresponding to the second electrode plate group. In order to form steps on the substrate, for example an insulation layer or the like having differences in height may be formed on the substrate, or the substrate may be ground down by etching or the like to form differences in height in the substrate itself. Furthermore, in the first step, a substrate with steps formed on the upper surface may be prepared.

In the method of manufacturing an organic light-emitting display panel according to the above aspect of the present invention, a size of an upper opening of each of the first contact holes may be equal to, or an approximation of, a size of an upper opening of each of the second contact holes.

With the above structure, even if the size of the upper opening of the first contact hole and the size of the upper opening of the second contact hole are equal, or an approximation of each other, the volume of the first contact hole is made larger than the volume of the second contact hole by changing the depth of the first and second contact holes. As a result, the difference between the film thickness of the first organic functional layer and the film thickness of the second organic functional layer is finely adjusted.

Furthermore, by making the size of the upper opening of the first and second contact holes substantially equal, the area of the opening of the first and second concavities becomes substantially equal. This allows the ink, which includes material for the organic functional layer, to enter into the concavities with roughly equal ease.

The method of manufacturing an organic light-emitting display panel according to the above aspect of the present invention may further comprise, between the fourth step and the fifth step, an additional step of: forming a first pixel defining layer to cover the first concavity, and a second pixel defining layer to cover the second concavity, wherein in the sixth step, the first organic functional layer is formed above the first pixel defining layer, and in the seventh step, the second organic functional layer is formed above the second pixel defining layer.

With the above structure, a pixel defining layer that has insulating properties covers the concavity, thereby electrically insulating the concavity and the organic functional layer. This prevents a local concentration of current from causing the light-emitting layer to emit light at different brightness by, for example, the rim of the concavity than in a region near the concavity.

The first pixel defining layer and second pixel defining layer are formed, for example, from an oxide (including a nitride) such as a $SiO_2$ film, a SiN film, etc When ink including material for the organic functional layers is sprayed directly on the pixel defining layers, the first and second organic functional layers easily enter the first and second concavities respectively.

In the method of manufacturing an organic light-emitting display panel according to the above aspect of the present invention, in the sixth step, the first organic functional layer may be formed to be continuous above the first electrode plate group due to ink drops of a predetermined volume being sprayed via an inkjet method, and in the seventh step, the second organic functional layer may be formed to be continuous above the second electrode plate group due to ink drops of the predetermined volume, or an approximation of the predetermined volume, being sprayed via the inkjet method.

With the above structure, the same spraying conditions for each color are maintained when using the inkjet method, which simplifies both manufacturing equipment and the manufacturing process. Furthermore, since the volume of the first contact hole is larger than the volume of the second contact hole, the film thickness of the first organic functional layer is less than the film thickness of the second organic functional layer. In other words, the difference in film thickness between organic functional layers corresponding to different colors is finely adjusted.

In the method of manufacturing an organic light-emitting display panel according to the above aspect of the present invention, a difference between the film thickness of the first organic functional layer and the film thickness of the second organic functional layer may be larger than an increase in the film thickness of the first organic functional layer when a number of ink drops of the predetermined volume sprayed on each of the first electrode plates via the inkjet method is increased by n drops, and smaller than the increase in the film thickness of the first organic functional layer when the number of ink drops is increased by n+1 drops.

With the above structure, the difference between the film thickness of the first organic functional layer and the film thickness of the second organic functional layer is finely adjusted in increments that are smaller than the film thickness of a layer formed by one ink drop, the smallest unit for spraying by the nozzles of the inkjet apparatus. Note that the film thickness of the first organic functional layer refers to the film thickness of a portion of the first organic functional layer corresponding to a region other than the first concavity in any of the first electrode plates. The same is true for the film thickness of the second organic functional layer.

A method of manufacturing an organic light-emitting display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line, a second electrode plate group including a plurality of second electrode plates corresponding to a second color and arranged in a line, and a third electrode plate group including a plurality of third electrode plates corresponding to a third color and arranged in a line; a fifth step of forming a first bank along a longitudinal first edge of the first electrode plate group, a second bank between a longitudinal second edge of the first electrode plate group and a longitudinal first edge of the second electrode plate group, a third bank between a longitudinal second edge of the second electrode plate group and a longitudinal first edge of the third electrode plate group, and a fourth bank along a longitudinal second edge of the third electrode plate group; a sixth step of forming a continuous first organic functional layer between the first bank and the second bank and above the first electrode plate group; a seventh step of forming a continuous second organic functional layer between the second bank and the third bank and above the second electrode plate group; an eighth step of forming a continuous third organic functional layer between the third bank and the fourth bank and above the third electrode plate group; and a ninth step of forming a counter electrode disposed to cover the first organic functional layer, the second organic functional layer, and the third organic functional layer, wherein in the third step, the interlayer insulation film is formed thicker at a location where the first electrode plate group is formed than at both a location where the second electrode plate group is formed and a location where the third electrode plate group is formed, the interlayer insulation film is provided with first contact holes, each connecting one of the first electrode plates with the TFT layer, second contact holes, each connecting one of the second electrode plates with the TFT layer, and third contact holes, each connecting one of the third electrode plates with the TFT layer, any of the first contact holes having a greater depth and a larger volume than any of the second contact holes and any of the third contact holes, in the fourth step, each of the first electrode plates is formed to have a first concavity shaped in conformity with one of the first contact holes, each of the second electrode plates is formed to have a second concavity shaped in conformity with one of the second contact holes, and each of the third electrode plates is formed to have a third concavity shaped in conformity with one of the third contact holes, and in the first organic functional layer formed in the sixth step, the second organic functional layer formed in the seventh step, and the third organic functional layer formed in the eighth step, the volume of a portion of the first organic functional layer above any of the first electrode plates is equal to, or an approximation of, the volume of a portion of the second organic functional layer above any of the second electrode plates and the volume of a portion of the third organic functional layer above any of the third electrode plates, and an amount of the first organic functional layer that has entered into the first concavity is larger than both an amount of the second organic functional layer that has entered into the second concavity and an amount of the third organic functional layer that has entered into the third concavity, so that a film thickness of the first organic functional layer in a region other than the first concavity in any of the first electrode plates is less than both a film thickness of the second organic functional layer in a region other than the second concavity in any of the second electrode plates and a film thickness of the third organic functional layer in a region other than the third concavity in any of the third electrode plates.

With the above structure, an organic light-emitting element corresponding to the third electrode plate group is provided in addition to the organic light-emitting elements corresponding to the first and second electrode plate groups. This achieves organic light-emitting elements of three different luminescent colors. Setting the three colors to be red, green, and blue (RGB) yields an organic light-emitting display panel with excellent light-extraction efficiency.

In the organic light-emitting display panel according to the above aspect of the present invention, the contact hole may have a top opening and a bottom opening respectively at an upper surface and a bottom surface of the interlayer insulation film, and in the concavity shaped in conformity with the contact hole, each of the electrode plates may be electrically connected to the TFT layer through the bottom opening of the contact hole.

In the organic light-emitting display panel according to the above aspect of the present invention, the contact hole may have an upper portion and a lower portion, the upper portion continuously decreasing in diameter from the top opening towards the bottom opening, and the lower portion continuously increasing in diameter from the bottom opening towards the top opening, and a step (or a step face) may exist between the upper portion and the lower portion.

Embodiment 1

Structure of Display Panel 100

Figure 2:
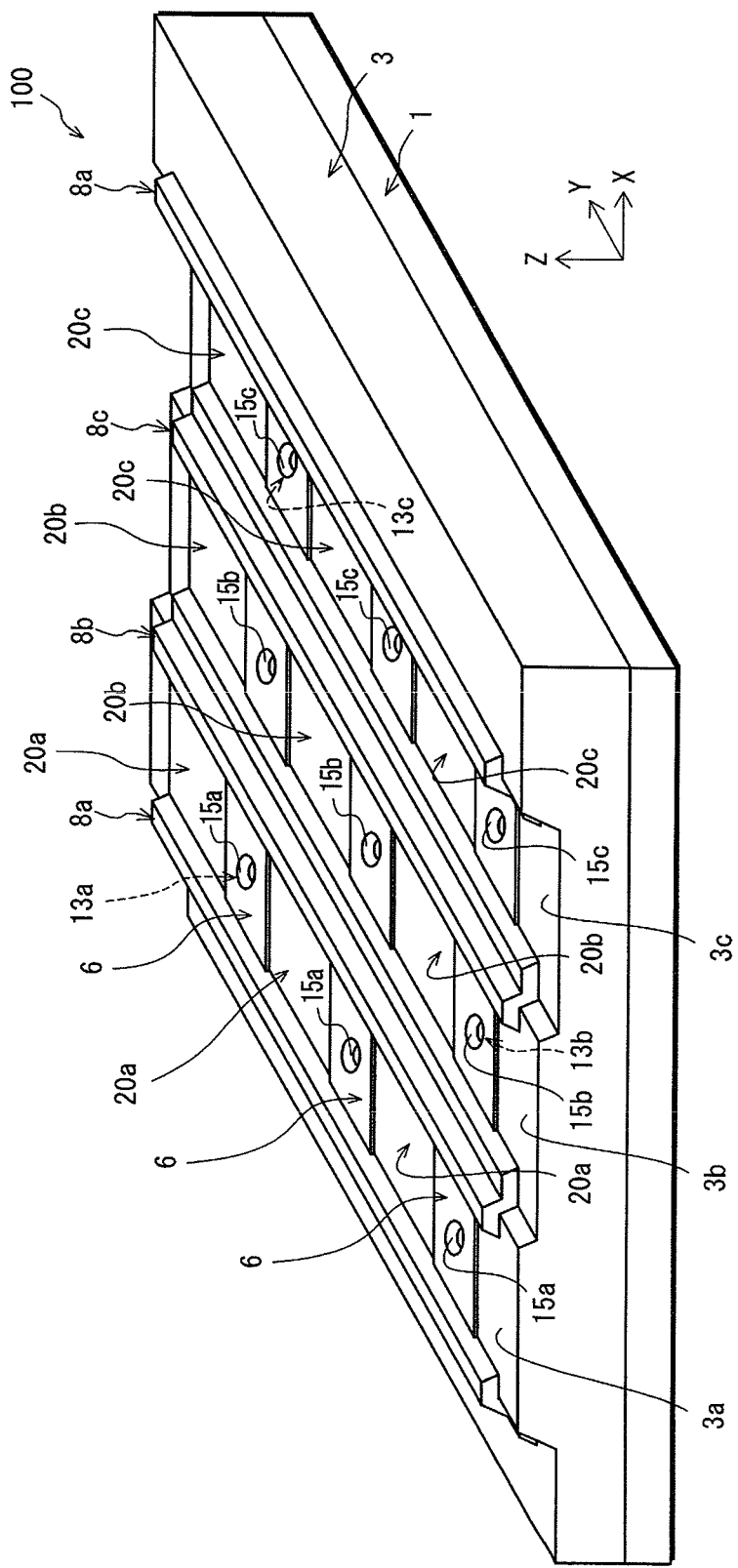
FIG. 2 is a perspective view showing the structure of the display panel 100.

FIG. 1 is a cross-section diagram schematically showing the structure of the main parts of a display panel 100 according to Embodiment 1. FIG. 2 is a perspective view showing the structure of the main parts of the display panel 100.

The display panel unit 100 is an organic light-emitting display panel that uses the phenomenon of electroluminescence occurring in organic material. Pixels are arranged in a matrix in the lateral and longitudinal (X and Y) directions in the display panel 100. Each pixel is formed by three adjacent sub-pixels whose colors are respectively red, green, and blue (RGB). The organic light-emitting elements 20*a*, 20*b*, and 20*c* shown in FIG. 2 are top-emission type light-emitting elements. The organic light-emitting elements 20*a* are sub-pixels of a first color (blue), the organic light-emitting elements 20*b* are sub-pixels of a second color (green), and organic light-emitting elements 20*c* are sub-pixels of a third color (red).

The region in which each organic light-emitting element 20 is formed in plan view is referred to as an "element-formation region". Within each element-formation region, the region that emits light is referred to as a "sub-pixel".

As shown in FIG. 2, the blue organic light-emitting elements 20*a*, green organic light-emitting elements 20*b*, and red organic light-emitting elements 20*c* are arranged in longitudinal lines (in the direction of the Y axis) in this order. Three organic light-emitting elements 20*a*, 20*b*, and 20*c* that are contiguous laterally (in the direction of the X axis) form one pixel.

FIG. 1 shows a cross-section of an organic light-emitting element 20*c* cut out longitudinally (in the direction of the Y axis). The display panel 100 is provided with a thin-film transistor (TFT) substrate formed by a substrate 1 and a TFT layer 2 layered on the principal surface of the substrate 1.

An interlayer insulation film 3, anode plates 5, pixel defining layers 6, and hole-injection layers 7 are layered on the TFT substrate in the display panel 100 in this order. Furthermore, banks 8, intermediate layers 9, organic light-emitting layers 10 (hereinafter simply "light-emitting layers"), and a cathode layer 11 are formed thereabove, thus forming the organic light-emitting elements 20a, 20b, and 20c.

Note that in FIG. 1, at the top of the figure in the direction of the Z axis, the side of a bank 8 that is at the back of the cross-section is shown in white (the same being true for FIGS. 3B and 3C as well). Note also that in FIG. 2, the intermediate layers 9, light-emitting layers 10, and cathode layer 11 are not shown.

The substrate 1 forms the base of the display panel 100 and is formed with an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

The TFT layer 2 includes thin-film transistors (TFT), wiring lines, etc. The TFTs are for driving the organic light-emitting elements 20a-20c in the entire panel by an active matrix method. In FIG. 1, the TFT layer 2 is shown schematically by a line with alternate long and two short dashes, and SD electrodes 22 connected to the source electrodes and the drain electrodes of the TFTs are shown representatively.

The interlayer insulation film 3 is formed from an organic material with excellent insulating properties such as polyimide, polyamide, or acrylic resin and covers the entire TFT layer 2 of the substrate 1.

Contact holes 13a, 13b, and 13c are bored in the direction of thickness (direction of Z axis) of the interlayer insulation film 3 at each respective organic light-emitting element 20a, 20b, and 20c (see FIGS. 1, 3A-3C). The contact holes 13 are circular holes with an opening at the top surface and at the bottom surface of the interlayer insulation film 3. The contact holes 13a, 13b, and 13c are also referred to simply as contact holes 13, without differentiating therebetween. Note that in addition to being circular, the cross-sectional shape of the contact holes 13 (the shape of a cross-section parallel to the XY plane) may be elliptical, rectangular, etc.

The height of the interlayer insulation film 3 differs at locations corresponding to the different color organic light-emitting elements 20a, 20b, and 20c. Therefore, the depths of the contact holes 13a, 13b, and 13c differ from one another.

As a result of the anode plates 5, pixel defining layers 6, and hole-injection layers 7 being layered in the contact holes 13 in accordance with the concave shape thereof, the hole-injection layers 7 have concavities 15 with a similar shape to the contact holes 13. In FIG. 2, the contact holes 13 are hidden below the concavities 15. Therefore, a dashed lead line indicates the reference numbers for the contact holes 13 (the same being true for FIG. 3A as well).

Next, the structure of the display panel 100 is described in detail with reference to FIGS. 3A-3C. FIG. 3A is a plan view showing the structure of the display panel 100, FIG. 3B is a cross-section diagram from A to A' in FIG. 3A, and FIG. 3C is a cross-section diagram from B to B' in FIG. 3A. Note that in FIG. 3A as well, the intermediate layers 9, light-emitting layers 10, and cathode layer 11 are not shown.

As shown in FIGS. 3B and 3C, the height of the upper surface of the interlayer insulation film 3 changes stepwise laterally (in the direction of the X axis). Specifically, as shown in FIG. 2, along the upper surface of the interlayer insulation film 3, a first surface 3a, second surface 3b, and third surface 3c, which are respectively a top level, intermediate level, and lower level, are repeatedly arranged laterally (in the direction of the X axis). The spaces between the first surfaces 3a, second surfaces 3b, and third surfaces 3c are connected by slanted surfaces.

The first surface 3a, second surface 3b, and third surface 3c each have a long, thin strip-like planar shape extending longitudinally (in the direction of the Y axis). The height of the upper surface is uniform throughout each of the surfaces 3a, 3b, and 3c.

As shown in FIG. 3A, the contact holes 13 are arranged in lines in the same way as the organic light-emitting elements 20. The contact holes 13 are arranged near each other laterally (in the direction of the X axis) and with a predetermined distance between each other longitudinally (in the direction of the Y axis), i.e. at an even pitch.

As shown in FIG. 3B, the sizes of the upper openings of the contact holes 13a, 13b and 13c corresponding to each color are substantially equal (details on the size of the upper opening are provided below). On the other hand, the contact holes 13a, 13b, and 13c have differing depths and volumes due to being provided respectively on the first surface 3a, second surface 3b, and third surface 3c, which have different heights.

Specifically, the contact hole 13a is the deepest and has the largest volume. By contrast, the contact hole 13c is the most shallow and has the smallest volume. The contact hole 13b has an intermediate depth and volume.

In other words, the volumes of the contact holes 13a, 13b, and 13c corresponding to the colors blue, green, and red are set so that the contact hole 13a corresponding to the color blue has the largest volume, and the contact hole 13c corresponding to the color red has the smallest volume. As a result, the volume of the concavity 15a that forms in the blue element-formation region is the largest, and the volume of the concavity 15c that forms in the red element-formation region is the smallest.

The openings at the bottom of the contact holes 13a, 13b, and 13c are blocked, being covered by the upper surface of the SD electrodes 22. In other words, the upper surface of the SD electrodes 22 corresponds to the "locations corresponding to the bottom of the contact holes in the TFT layer". Note that the upper surface of the SD electrodes 22 can also be thought of as forming the "bottom of each of the first, second, and third contact holes in the TFT substrate".

Figure 9A:
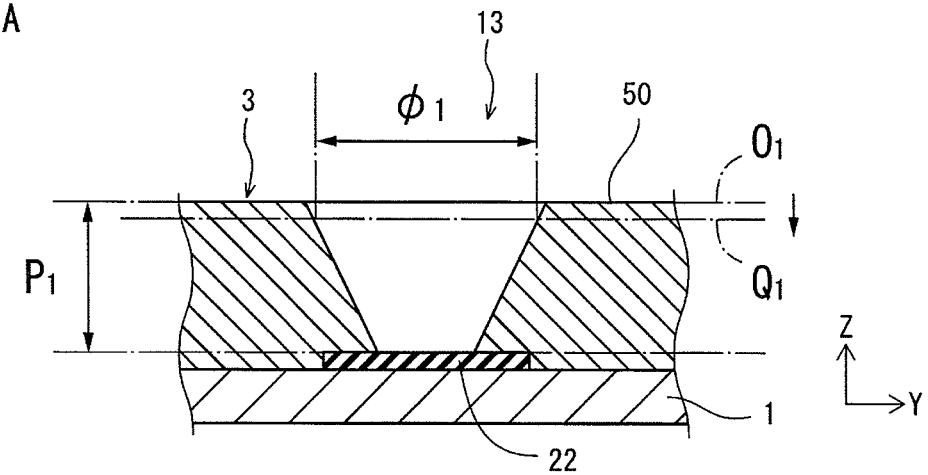
FIGS. 9A-9C illustrate the size of an upper opening of a contact hole 11.
Figure 9B:
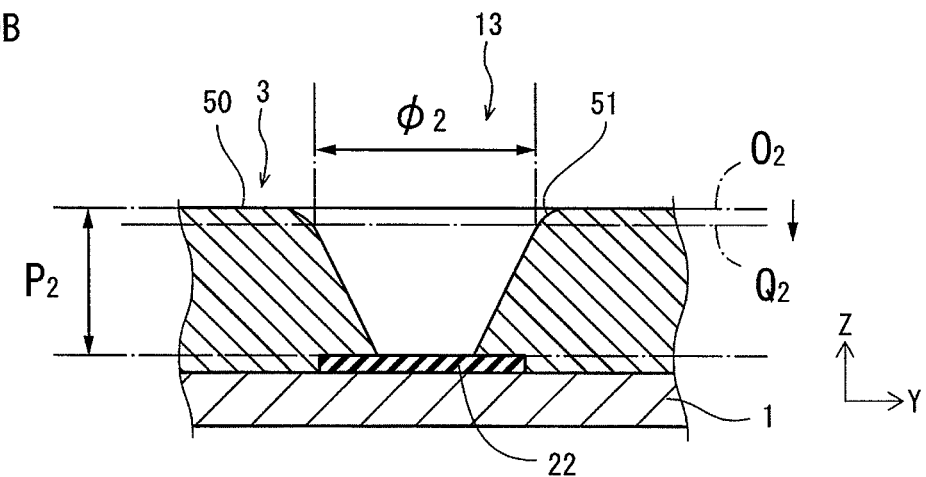
Figure 9C:
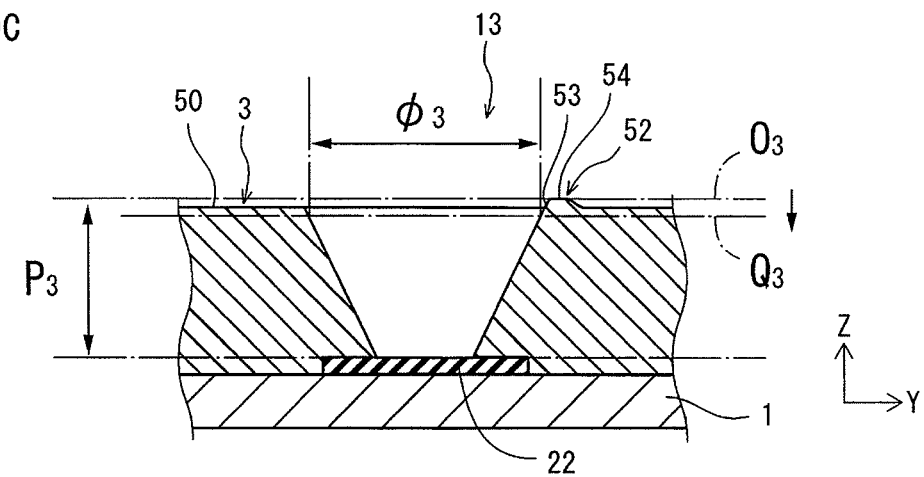

In the present Embodiment, the height of the upper surface of each of the SD electrodes 22 corresponding to the contact holes 13a, 13b, and 13c is set to be substantially equal. Specifically, the difference between the height of the upper surface of each of the SD electrodes 22 corresponding to the contact holes 13a, 13b, and 13c is set to be within 5% of the difference between the depth of the first contact hole 13a and the third contact hole 13c. Note that the depth of the contact holes is determined by the depth P1 or P3, exemplified below (FIGS. 9A-9C).

The anode plates 5 (5a-5c) are an example of electrode plates and are rectangular in plan view. The anode plates 5 are formed on the interlayer insulation film 3 in the element-formation region of each of the organic light-emitting elements 20 (in the sub-pixel regions and the regions above the contact holes 13). The anode plates 5 are equal in size and are arranged longitudinally (in the direction of the Y axis) and laterally (in the direction of the X axis) in lines at intervals of a predetermined distance.

As shown in FIGS. 3B and 3C, part of each anode plate 5 is formed along the inner surface of the contact hole 13, thus having a concavity 23 with a shape similar to the contact hole 13. Along the bottom wall of the concavity 23, the anode plate 5 is electrically connected to the SD electrode 22 in the TFT layer 2.

The anode plates 5 are &allied from a metal material, such as silver-palladium-copper alloy, Ag (silver), a silver-rubidium-gold alloy, MoCr (alloy of molybdenum and chromium), NiCr (alloy of nickel and chromium), aluminum, an aluminum alloy, etc. The anode plates are preferably light-reflective. A semiconductor material such as Indium Tin Oxide (ITO), IZO ($In_2O_3$—ZnO), ZnO, InO, SnO, etc. may also be used. Furthermore, the above semiconductor material may be layered on the above metal material to form the anode plates 5.

The pixel defining layers 6 are electrically insulating films extending laterally (in the direction of the X axis) that cover the concavities 23 and the longitudinal edges (in the direction of the Y axis) of the anode plates 5.

In the areas where the pixel defining layers 6 are formed, electrical conduction between the anode plates 5 and the cathode layer 11 is cut off. Therefore, even if a driving voltage is applied to the organic light-emitting elements 20 in these areas, no light is emitted. In other words, the pixel defining layers 6 restrict light emission longitudinally (in the direction of the Y axis) between sub-pixels. Therefore, the pixel defining layers 6 partition a plurality of sub-pixels longitudinally (in the direction of the Y axis). The pixel defining layers 6 have equal widths and are arranged at an even pitch so that each of the sub-pixels will be of a uniform size longitudinally (in the direction of the Y axis).

By covering the concavities 23 and the edges of the anode plates 5, the pixel defining layers 6 prevent the uneven brightness described below, as well as the occurrence of a short between the anode plates 5 and the cathode layer 11. Specifically, the film thickness of the light-emitting layer 10 becomes thin at the edges of the anode plates 5 and by the rim of the concavities 23. If current accumulates locally in these areas, a local increase in brightness may occur, resulting in uneven brightness. Furthermore, if the light-emitting layers 10 or other layers become discontinuous at the edges of the anode plates 5 or by the rim of the concavities 23, a short may occur between the anode plates 5 and the cathode layer 11.

The pixel defining layers 6 are an insulating, inorganic film formed from silicon oxide (SiO), silicon nitride (SiN), silicon oxynitride (SiON), etc. The thickness is approximately 100 nm-300 nm.

The hole-injection layers 7 (7a-7c) are formed from an oxide of molybdenum or tungsten or other transition metals and are layered on the anode plates 5 and the pixel defining layers 6.

In the region above the contact holes 13, the hole-injection layers 7 enter the concavities 23 in the anode plates 5 along with the pixel defining layers 6, thus forming concavities 15 with the same shape as the concavities 23. Note that the film thicknesses of the pixel defining layers 6 and the hole-injection layers 7 are much smaller than the size of the concavities 23 (the diameter and the depth thereof). Therefore, the volume of the concavities 15 formed in the hole-injection layers 7 is approximately the same as the volume of the concavities 23 formed in the anode plates 5.

The banks 8 (8a-8c) are formed from an organic material with insulating properties (such as acrylic resin, polyimide resin, novolac-type phenolic resin, etc.) and at least the surface thereof is provided with repellency. The banks 8a, 8b, and 8c are formed in long, longitudinal lines (in the direction of the Y axis) with equivalent lateral pitch (in the direction of the X axis), so as to exist between organic light-emitting elements 20a, 20b, and 20c that are contiguous laterally. The cross-sectional shape of each bank 8a, 8b, and 8c is a trapezoid, and the width (the dimension in the direction of the X axis) of each bank is uniform.

The intermediate layers 9 (9a-9c) are an example of the organic functional layer and are formed in the areas between contiguous banks 8, so as to cover the hole-injection layers 7. The intermediate layers 9 partially fill the concavities 15 in the pixel defining layers 6. The intermediate layers 9 are formed to be continuous longitudinally (in the direction of the Y axis).

Note that, as described below, the volume of the concavities 15 differs in accordance with differences in the volume of the contact holes 13a, 13b, and 13c which correspond to the different colors, and therefore the film thickness of the intermediate layers 9 differs in the light-emitting areas, etc.

Between a bank 8a and a bank 8b, an intermediate layer 9a corresponding to the color blue is formed. Between the bank 8b and a bank 8c, an intermediate layer 9b corresponding to the color green is formed. Between the bank 8c and the bank 8a, an intermediate layer 9c corresponding to the color red is formed.

The light-emitting layers 10 (10a-10c) are formed above the intermediate layers 9, in the areas between contiguous banks 8. The light-emitting layers 10 partially fill the concavities 15 along with the intermediate layers 9.

A light-emitting layer 10a that emits blue light is formed above the intermediate layer 9a. A light-emitting layer 10b that emits green light is formed above the intermediate layer 9b. A light-emitting layer 10c that emits red light is formed above the intermediate layer 9c.

The intermediate layers 9 are made from material with excellent hole mobility and transport holes to the light-emitting layers 10. Examples of the material used to form the intermediate layers 9 include triarylamine-based compounds such as 4-4'-Bis [N-(naphthyl)-N-phenyl-amino]biphenyl ($\alpha$-NPB or $\alpha$-NPD), N,N'-Bis (3-methylphenyl)-(1,1'-biphenyl)-4,4'-diamine (TPD), etc. Other examples include a biphenyl derivative, an anthracene derivative, an aniline derivative, a theophene derivative, etc.

Note that the anode plates 5, hole-injection layers 7, and intermediate layers 9 are formed from the same material for the three colors of organic light-emitting elements 20a, 20b, and 20c, whereas the light-emitting layers 10 are formed from light-emitting materials that emit light of different colors, namely blue, green, and red, respectively for the organic light-emitting elements 20a, 20b, and 20c.

Examples of the material in the light-emitting layers 10 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The cathode layer 11 is an example of an opposing electrode and is formed to cover all of the light-emitting layers 10 of the three colors of organic light-emitting elements 20a, 20b, and 20c. The cathode layer 11 is formed from a transparent material, such as ITO, indium zinc oxide (IZO), etc.

Note that, while not shown in the figures, a passivation layer is provided above the cathode layer 11. The passivation layer is formed from a transparent material such as silicon nitride (SiN), silicon oxynitride (SiON), etc.

In the display panel 100, the pitch and width of the banks 8 are uniform, as are the pitch and width of the pixel defining layers 6. Therefore, the size of the sub-pixels surrounded by the banks 8 and the pixel defining layers 6 is also uniform.

In the present Embodiment, as shown in FIG. 3A, a plurality of anode plates 5a for the color blue are arranged in a longitudinal line (in the direction of the Y axis) in the display panel 100, thus forming a first anode plate group (an example of the first electrode plate group). Next to the first anode plate group, a plurality of anode plates 5b for the color green are arranged in a longitudinal line (in the direction of the Y axis), thus forming a second anode plate group (an example of the second electrode plate group). Next to the second anode plate group, a plurality of anode plates 5c for the color red are arranged in a longitudinal line (in the direction of the Y axis), thus forming a third anode plate group (an example of the third electrode plate group).

In FIG. 3A, each anode plate group overall has a long, thin rectangular shape extending longitudinally (in the direction of the Y axis). Each anode plate group has two long sides, one to the left and one to the right. Along one long side (the left side) of the first anode plate group, a first bank (bank 8a) is formed. Between the other long side (the right side) of the first anode plate group and one long side (the left side) of the second anode plate group, a second bank (bank 8b) is formed. Between the other long side (the right side) of the second anode plate group and one long side (the left side) of the third anode plate group, a third bank (bank 8c) is formed. Along the other long side (the right side) of the third anode plate group, a fourth bank (bank 8a) is formed. Note that the fourth bank (bank 8a) becomes the first bank (bank 8a) for the neighboring pixel.

(Method of Manufacturing Display Panel 100)

First, an example of the main parts of a method of manufacturing the display panel 100 is described with reference to FIGS. 4A-4G.

The following describes the process of manufacturing the TFT substrate.

The substrate 1 is prepared in accordance with the size of the display panel 100. Alternatively, a substrate that is several times the size of the display panel 100 may be prepared, and a plurality of display panels 100 may be manufactured at the same time.

Formation of TFT Layer

A known method of manufacturing (for example, as recited in Japanese Patent Application Publication No. 2003-241683, Japanese Patent Application Publication No. 2008-300611, etc.) is used to form the TFT layer 2, which includes TFTs, wiring lines, and SD electrodes 22, on the substrate 1 (FIG. 4A). For example, the TFTs, SD electrodes 22, wiring lines, etc. may be formed by a sputtering method, by a chemical vapor deposition (CVD) method, etc.

During formation of the TFTs, gate electrodes, gate insulation films, sources, drains, and channel layers are formed. The SD electrodes 22 are each formed in electrical connection with either a source or a drain. The wiring lines are formed by a plurality of signal lines extending along the Y axis and a plurality of scanning lines extending along the X axis. The wiring lines are connected to the TFTs. Note that the TFTs may be top-gate TFTs with the gate electrode formed as the source above the drain and other components, or the TFTs may be bottom-gate TFTs with the gate electrode Rimed as the source below the drain and other components.

The following describes the process of manufacturing the interlayer insulation film.

Formation of Interlayer Insulation Film

A resist film 26 formed by positive photosensitive organic material is first applied to the TFT layer 2, and contact holes 13 are then formed at locations above the SD electrodes 22 in the resist film 26.

The resist film 26 is applied by a liquid film formation method such as spin coating. The surface of the TFT layer 2 is planarized by filling in surface irregularities. Note that the resist film 26 may alternatively be applied by another liquid film formation method such as dip coating, slit coating, spray coating, roll coating, or dye coating.

Photolithography is used to form the contact holes 13 and the levels in the interlayer insulation film 3. The first surface 3a, second surface 3b, and third surface 3c are formed in the interlayer insulation film 3 (see FIGS. 5A and 5B).

The second surface 3b, third surface 3c, and contact holes 13 are respectively formed via three separate exposure and developing processes. For example, during the first exposure and developing process, the second surface 3b is formed. Subsequently, the exposure and developing process is repeated to form the third surface 3c. The contact holes 13 are then fanned during the final exposure and developing process.

In the present Embodiment, in a plan view of the interlayer insulation film 3, the section below the first surface 3a corresponds to the location where the first electrode plate group is formed, the section below the second surface 3b corresponds to the location where the second electrode plate group is formed, and the section below the third surface 3c corresponds to the location where the third electrode plate group is formed. Note that the section below the second surface 3b may also be considered to correspond to the location where the first electrode plate group is formed, and the section below the third surface 3c may also be considered to correspond to the location where the second electrode plate group is formed. Furthermore, the section below the second surface 3a may be considered to correspond to the location where the first electrode plate group is formed, and the section below the third surface 3c may also be considered to correspond to the location where the second electrode plate group is formed.

Note that the contact holes 13 and the levels in the interlayer insulation film 3 may be formed by one exposure and developing process by using a multi-tone mask. Use of a multi-tone mask is described with reference to FIGS. 5A and 5B. FIGS. 5A and 5B are cross-section diagrams schematically showing processing to form the contact holes 13 by photolithography.

A multi-tone mask 30 used for exposure is formed by a transparent portion 31 that lets light pass through, a semi-transparent portion 32 that weakens passing light, and a light blocking portion 33 that blocks light. The semi-transparent portion 32 may be arranged in patterns with much finer detail than the resolution of an exposure device, and the degree of transparency may be adjusted by adjusting the number of detailed patterns per unit of area. Alternatively, the degree of transparency may be adjusted by further layering a film with a predetermined degree of transparency. Intermediate exposure is achieved with this sort of semi-transparent portion 32. In particular, when varying the volume of the contact hole 13 for each color, R, G and B, it is preferable for the multi-tone mask 30 to be arranged in patterns with much finer detail than the resolution of the exposure device, and for the degree of transparency to be adjusted by adjusting the number of detailed patterns per unit of area.

In order to form the contact holes 13, the diameter of the opening of each of the transparent portions 31a, 31b, and 31c is approximately the same as the diameter of the corresponding openings 35a, 35b, and 35c (openings at the side of the substrate 1) at the bottom of the contact holes 13a, 13b, and 13c, respectively. The semi-transparent portion 32b has approximately the same shape as the outer perimeter of the second surface 3b, and the semi-transparent portion 32c has approximately the same shape as the outer perimeter of the third surface 3c. The portion of the multi-tone mask 30 other than the transparent portion 31 and the semi-transparent portion 32, for example the portion corresponding to the first surface 3a, is the light blocking portion 33.

The degree of transparency of the transparent portion 31 is high. Therefore, after developing, the bottom surface of the resist film 26 is exposed at the portions of the resist film 26 where light passed through the transparent portion 31.

By contrast, light shone on the resist film 26 is weakened by the semi-transparent portions 32b and 32c. Therefore, light that passes through the semi-transparent portion 32 only shines on the upper portions of the resist film 26. The upper portions are then removed by developing to form the second surface 3b and the third surface 3c. Note that in the semi-transparent portion 32, the semi-transparent portion 32b for forming the second surface 3b has a lower degree of transparency of light than the semi-transparent portion 32c for forming the third surface 3c. As a result, the second surface 3b is higher than the third surface 3c.

The range indicated schematically by the line with alternate long and two short dashes 36 in FIG. 5A receives light during exposure with the multi-tone mask 30 and is removed by being dissolved during developing. Note that light passing through the transparent portion 31 and the semi-transparent portion 32 spreads by diffraction. Therefore, portions of the resist film 26 that are larger than the transparent portion 31 and the semi-transparent portion 32 are exposed to light to some extent, making the side wall of the contact holes 13 inclined. As a result, the contact holes 13 are tapered.

Alternatively, after forming an insulation film (with organic or inorganic material) whose top surface is planarized, the locations where the contact holes are to be formed may be removed by etching, thus forming the contact holes 13.

A specific explanation follows. A photoresist is overlaid on the insulation film, and thereabove, a pattern mask is overlaid, the pattern mask matching the level (second surface 3b or third surface 3c) or the contact holes 13 to be formed on the interlayer insulation film 3. Next, after receiving light through the pattern mask, the light-sensitive (or non light-sensitive) portion of the photoresist is removed by developing to form the resist pattern. Subsequently, the portions of the insulation film exposed to the openings of the resist pattern are removed by, for example, wet etching, thus forming the levels or the contact holes 13 on the insulation film. The insulation film is pattered by performing this sort of exposure and developing three times, thus forming the interlayer insulation film 3.

The following describes the process of forming the organic light-emitting elements of each color.
Formation of Anode Plates A thin film, approximately 100 nm to 200 nm thick, of a metal material (alloy of silver, palladium, and copper) is formed on the interlayer insulation film 3, and a thin film, approximately 90 nm thick, of semiconducting material (IZO) is formed on the metal material layer.

The anode plates 5, which are rectangular in plan view, are then formed in lines by photolithography. Specifically, a resist film is formed on the semiconducting material. The resist film is exposed to light using a mask pattern in which rectangular anode plate shapes are arranged in lines. The exposed part is then removed by being dissolved in tetramethylammonium hydroxide (TMAH). Furthermore, via wet etching (for example, etching with a water solution of phosphate, nitric acid, and acetic acid), lattice-shaped portions of the metal material film and the semiconducting material film that are not covered by the resist film are removed and patterning is performed to form the rectangular anode plates 5. The resist film is then removed.

The anode plates 5 at this point are also formed on the inner surface of the contact holes 13. Therefore, the anode plates 5 are concave in conformity with the inner surface of the contact holes 13, and concavities 23 are formed in the anode plates 5. The bottom wall of the concavities 23 is in surface contact with and electrically connected to the SD electrodes 22 through the opening at the bottom of the contact holes 13 (FIG. 4C).
Formation of Pixel Defining Layers Next, a 100 nm to 300 nm film of SiON is formed by CVD. Using photolithography, the pixel defining layers 6 are then formed through patterning by dry etching (FIG. 4E).
Formation of Hole-Injection Layers Next, on the anode plates 5 and the pixel defining layers 6, a metal oxide film such as molybdenum oxide, tungsten oxide, etc. is formed by reactive sputtering, thus forming the hole-injection layers 7 (FIG. 4D).

The pixel defining layers 6 and hole-injection layers 7 also have a partially concave shape, along the concavities 23a, 23b, and 23c in the anode plates 5. As a result, concavities 15a, 15c, and 15c are formed in the hole-injection layers 7. The pixel defining layers 6 and the hole-injection layers 7 have approximately the same film thickness in the sub-pixels and in the concavities 23.
Formation of Banks FIG. 6 schematically shows a cross-section from A-A' in the process of formation of the banks.

Resist material is sprayed on the interlayer insulation film 3 as bank material and patterned via photolithography to form a resist film 37. The resist material is, for example, a photoresist, or resist material that includes fluorine-based or acrylic material. The resist film 37 is patterned by photolithography using a monotone mask 38 to form banks 8a, 8b, and 8c (FIGS. 4F, 6A).

Note that, during this process of forming the banks, the surface of the banks 8 may be treated with an alkaline solution, water, or an organic solvent, or by plasma treatment, in order to provide the surface of the banks 8 with repellency with respect to the next ink to be sprayed.
Formation of Intermediate Layers Next, the intermediate layers 9 are formed by an inkjet method (inkjet spraying method) (FIG. 4G).

To do so, the organic material for the intermediate layer is mixed with solvent at a predetermined ratio to manufacture intermediate layer ink. This ink is then sprayed between adjacent banks 8. Specifically, ink is sprayed using a known inkjet method in the regions between bank 8a (the first bank) and bank 8b (the second bank), between bank 8b and bank 8c (the third bank), and between bank 8c and bank 8a (the fourth bank).

FIG. 7 is a schematic cross-section diagram showing conditions immediately after spraying ink for forming the intermediate layers on the substrate and after drying the ink. Note that in FIG. 7, the hole-injection layers 7 are omitted.

As shown by the arrows in FIG. 7, ink is dripped in a predetermined number of locations in each element-formation region from the nozzles of the inkjet apparatus. In other words, the number of drops (for example, eight) dripped in each element-formation region and the number of locations in which ink is dripped in each element-formation region is made uniform. As a result, the ink that is sprayed covers the entire surface of the hole-injection layers 7, also entering the concavities 15 that exist due to the contact holes 13.

Since the amount of each drop of ink ejected from the nozzle is constant, a uniform amount of ink is sprayed into element-formation regions. In other words, the amount of ink sprayed on each anode plate 5 is equivalent, with variation equal to or less than 5%.

Note that alternative methods for filling the regions between banks with ink that forms the intermediate layers 9 include a dispenser method, nozzle coating method, printing method, etc. In all of these methods, the amount of ink sprayed on each anode plate 5 and hole-injection layer 7 is equivalent for sub-pixels of each color.

By drying the ink layers thus formed, the intermediate layers 9 form.

Formation of Light-Emitting Layers

On the intermediate layers 9, the light-emitting layers 10 are formed by the wet method. This process is the same as the above process of forming the intermediate layers. Organic light-emitting material for forming the light-emitting layers is dissolved to yield ink. The ink is sprayed between adjacent banks 8 and dried to form the light-emitting layers. The organic light-emitting material that is used differs by luminescent color.

Note that light-emitting layers 10 formed from low-molecular organic light-emitting material may be formed on the intermediate layers 9 by, for example, a vacuum deposition method. Alternative methods for filling the regions between banks with ink that forms the light-emitting layers 10 include the dispenser method, nozzle coating method, printing method, etc.

Formation of Cathode Layer, Etc.

Next, on the surface of the light-emitting layers 10, a film of ITO, IZO, etc. material is formed by the sputtering method or the vacuum deposition method. The cathode layer 11 is thus formed. Furthermore, on the surface of the cathode layer 11, a film of silicon nitride (SiN), silicon oxynitride (SiON), etc. material is formed by the sputtering method or the vacuum deposition method to form the passivation layer.

All of the organic light-emitting elements 20a-20c are formed by the above processes, thus completing the display panel 100.

Volume of Contact Holes 13 and Concavities 15, Film Thickness of Intermediate Layers 9

In the display panel 100, the volume of the contact holes 13 is set so that the volume of the contact hole 13a, corresponding to the color blue, is the largest, and the volume of the contact hole 13c, corresponding to the color red, is the smallest (13a>13b>13c). Accordingly, the volume of the concavities 15 varies, the volume of the concavity 15a formed above the contact hole 13a being the largest, and the volume of the concavity 15c formed above the contact hole 13c being the smallest (15a>15b>15c). The intermediate layers 9a, 9b, and 9c corresponding to the different colors are set to have the same volume in the regions above the anode plates 5. However, the volume (amount) of each intermediate layer that enters into the concavities 15a, 15b, and 15c differs.

As a result, the film thickness of the intermediate layer 9a in the blue sub-pixel (the film thickness in the region above the anode plate 5 in a region other than the concavity 15) is the thinnest, the film thickness of the intermediate layer 9b in the green sub-pixel is an intermediate thickness, and the film thickness of the intermediate layer 9c in the red sub-pixel is the thickest.

By thus varying the volume of the concavities 15a, 15b, and 15c, the difference in film thickness between the intermediate layers 9a, 9b, and 9c is finely adjusted. Accordingly, in the display panel 100, it is easy to set the film thickness of the intermediate layers 9 to be appropriate for the wavelength of the luminescent color in each sub-pixel.

The following is a detailed consideration of the relationship between the volume of the concavities 15 formed above the anode plates 5 and the film thickness of the intermediate layers 9. Note that the concavities 15 are formed by the pixel defining layers 6 and the hole-injection layers 7 entering into the concavities 23 formed on the anode plates 5 and thus adopting the shape of the concavities 23. Since the pixel defining layers 6 and the hole-injection layers 7 are formed by CVD or by the sputter method, the concavities 15 have an extremely similar shape to the concavities 23. As compared to the size of the concavities 23 (diameter and depth), the film thickness of the hole-injection layers 7 and other layers is much smaller, and these layers therefore have little effect on the volume of the concavities 23.

As is clear from the above considerations, it poses no particular problem to consider the concavities 23 and the concavities 15 as being identical. While the first, second, and third concavities are, strictly speaking, formed by the concavities 23a, 23b, and 23c, for the sake of convenience, the first, second, and third concavities may thus be considered to be formed by the concavities 15a, 15b, and 15c.

Furthermore, a longitudinal gap (in the direction of the Y axis) between neighboring anode plates 5 is extremely small as compared to the longitudinal length of each anode plate 5, and therefore the gap is not taken into consideration in the following calculations. Note that the film thickness of the intermediate layers 9 in the sub-pixels is simply referred to as the film thickness of the intermediate layer 9.

In one element-formation region, let the area of an ink-spraying region, i.e. the region where ink is sprayed on the anode plate 5 (the region indicated by reference number 5 in FIG. 3A), be S. Let the solute concentration of the ink used for the intermediate layer be N. Furthermore, let the amount of ink sprayed in one ink-spraying region (the hatched region C in FIG. 7) be V0, and let the volume of the concavity 15 formed on the anode plate 5 be V1 (with the volume of the concavities 15a, 15b, and 15c corresponding to each color respectively being V1a, V1b, and V1c).

FIGS. 8A, 8B, and 8C are greatly simplified versions of FIG. 7 schematically showing a state in which ink has been sprayed in the ink-spraying region (left side) and a state in which the ink has dried (right side). In the following explanation, the ink-spraying region, concavity 15, etc. are treated as simplified in FIGS. 8A-8C in order to consider the relationship between the volume of the concavity 15 and the film thickness of the intermediate layer 9. Note that in FIGS. 8A-8C, the anode plate 5, pixel defining layer 6, etc. are omitted.

(1) Difference in Film Thickness of the Intermediate Layer 9 Depending on the Presence of the Concavity First, the relationship between the volume of the concavity 15 and the film thickness of the intermediate layer 9 is described.

FIG. 8A shows states before and after drying of ink, assuming that no concavity 15 is formed. Assuming that the entire upper surface of the anode plate 5 is even, and that no concavity exists, the hypothetical height H0 of the ink layer sprayed on the anode plate 5 is obtained by dividing the amount of sprayed ink V0 by the area S.

$$H0 = V0/S \quad (1\text{-}1)$$

The intermediate layer 9 that forms after drying has a hypothetical height of h0, obtained by multiplying the hypothetical height H0 of the ink layer by the solute concentration N.

$$h0 = N \times H0 \quad (1\text{-}2)$$
$$= N \times V0/S$$

FIGS. 8B and 8C show states before and after drying of ink when a concavity 15 is formed. Note that in FIGS. 8B and 8C, ink that enters in the concavity 15 and dries is distinguished from an ink layer that is above the concavity 15 and dries. Details regarding this distinction are provided below.

When a concavity 15 (volume V1) is formed on the anode plate 5, part of the ink that is sprayed fills the concavity 15. It is assumed that ink Mk the entire concavity 15, as in the hatched region D in FIG. 7. The upper surface of the ink after spraying may to some extent be uneven, but in the following estimations, it is assumed that the upper surface is even.

The height H (Ha, Hb, Hc) of the ink layer in the sub-pixels can thus be calculated in the same way when ink is sprayed on an anode plate with no concavity, using instead a remaining amount of ink V0−V1, i.e. the amount of sprayed ink V0 minus the amount of ink V1 that fills the concavity 15 (see FIG. 8B).

Accordingly, the height H of the ink layer is obtained by dividing the remaining amount of ink (V0−V1) by the area S.

$$H = (V0 - V1)/S \quad (1\text{-}3)$$

The film thickness h (ha, hb, hc) of the intermediate layer 9 after the ink dries is obtained by multiplying the height H of the ink layer by the solute concentration N of the ink for the intermediate layer.

$$h = N \times H \quad (1\text{-}4)$$
$$= N(V0 - V1)/S$$

Comparing FIGS. 8A and 8B, it is clear that due to the concavity 15 being filled with ink, the height H of the ink layer in the sub-pixels is shorter than the hypothetical height H0 (indicated by the line J in FIG. 8B). As a result, the film thickness h of the intermediate layer 9 after drying is less than the hypothetical height h0.

When it is assumed that no concavity 15 is formed on the anode plate 5, the hypothetical height h0 of the intermediate layer 9 is N×V0/S. Accordingly, when comparing the film thickness h of the intermediate layer 9 with the hypothetical film thickness h0, an amount E by which the film thickness h decreases due to the concavity 15 is obtained by the following equation.

$$E = h0 - h \quad (1\text{-}5)$$
$$= N \times V0/S - N(V0 - V1)/S$$
$$= N \times V1/S$$

In other words, the amount E of decrease in the film thickness h of the intermediate layer 9 with respect to the hypothetical film thickness h0 is fundamentally based on the volume of the concavity 15. Accordingly, by increasing the volume (V1) of the concavity 15, the amount E of decrease in the film thickness h of the intermediate layer 9 with respect to the hypothetical film thickness h0 increases.

The volumes V1a, V1b, and V1c of the concavities 15 of the different colors are ordered as follows: V1a>V1b>V1c. Therefore, if the amount of sprayed ink V0 and the solute concentration N are set to be the same, the film thickness of the intermediate layer 9a in the blue sub-pixel is the thinnest, and the film thickness of the intermediate layer 9c in the red sub-pixel is the thickest.

(2) Difference in Volume of Concavities 15 and Difference in Film Thickness of Intermediate Layers 9 Between Each Color FIGS. 8B and 8C indicate the heights Ha and Hb of the ink layers and the film thicknesses ha and hb of the intermediate layers 9a and 9b. Note that for the sake of simplicity, in FIGS. 8A-8C, the anode plates 5 and other layers are omitted, and the cross-sectional shape of the concavity 15 is represented as a rectangle.

As a representative example, the following describes the relationship between (i) a difference $\Delta V1ab$ between the volumes of the concavities 15a and 15b and (ii) a difference in film thickness $\Delta hab$ between film thicknesses ha and hb of the intermediate layers 9, with the concavities and the intermediate layers corresponding to different colors.

Note that the amount of sprayed ink V0 and the solute concentration N are set to be equivalent between ink-spraying regions of different colors. Given these conditions, the difference in film thickness $\Delta hab$ between the film thickness ha of the intermediate layer 9a in the blue sub-pixel and the film thickness hb of the intermediate layer 9b in the green sub-pixel is obtained by the following equation.

$$\Delta hab = ha - hb \quad (2\text{-}1)$$
$$= N(V0 - V1a)/S - N(V0 - V1b)/S$$
$$= N(V1b - V1a)/S$$
$$= N \times \Delta V1ab/S$$

In other words, when the amount of ink V0 and the solute concentration N are equivalent in the ink-spraying regions of different colors, the above difference in film thickness $\Delta hab$ is fundamentally proportional to the difference $\Delta V1ab$ in the volumes of the concavity 15a corresponding to the color blue and the concavity 15b corresponding to the color green. Accordingly, adjusting the difference $\Delta V1$ between the volume of two of the concavities 15a, 15b, and 15c (for example, V1a−V1b) results in a corresponding difference in film thickness $\Delta h$ between the film thicknesses, ha, hb, or hc, of the intermediate layer 9 of two different colors (for example, ha−hb). In this embodiment, the volume V1a of the concavity 15a is larger than the volume V1b of the concavity 15b, and therefore V1a-V1b yields a negative value. This indicates that the film thickness ha is smaller than the film thickness hb.

Note that even if the amount of sprayed ink V0 and the solute concentration N vary by color, the difference in film thickness $\Delta h$ can still be adjusted by the same principle.

(3) Units by which Difference in Film Thickness of Intermediate Layer 9 is Adjusted The size of each concavity 15 is defined by the size of the contact hole 13 formed on the interlayer insulation film 3, and it is possible to finely adjust the size of each concavity 15 as described below. Accordingly, the volume V1a, V1b, V1c of the concavities can be adjusted in finer increments than the volume of one drop of ink, thus allowing for fine adjustment to the difference in film thickness of the intermediate layer 9 by color.

First of all, by way of comparative example, the following describes a method to adjust film thickness by changing the number of drops of ink sprayed in sub-pixels of different colors. Let the number of drops of ink sprayed in each ink-spraying region be M, and the volume of a drop of ink be V0/M, the amount of sprayed ink V0 divided by the number of drops of ink M. It follows that when the number of drops of ink sprayed in each ink-spraying region is increased or decreased by one drop (e.g. when comparing M drops vs. M+1 drops), the film thickness of the resulting intermediate layer changes by N(V0/M)/S. Therefore, the difference in film thickness can only be adjusted in increments equaling N(V0/M)/S.

The present Embodiment, on the other hand, allows for the difference in volume between the concavities 15a, 15b, 15c (e.g. V1a−V1b) to be adjusted in increments smaller than the volume of one drop of ink, i.e. V0/M (for example, in increments equaling half the volume of a drop of ink, i.e. V0/2M). Accordingly, the difference in film thickness Δh of the intermediate layer 9 can be set, for example, to N(V0/2M)/S, which is smaller than the difference in film thickness when changing the number of drops of ink by one drop. Furthermore, the difference in film thickness Δh of the intermediate layer 9 can, for example, be set larger than the difference in film thickness when the number of drops of ink is changed by n drops and smaller than the difference when the number of drops of ink is changed by n+1 drops.

Accordingly, the difference in film thickness Δhab between the film thickness ha of the intermediate layer 9a in the blue sub-pixel and the film thickness hb of the intermediate layer 9b in the green sub-pixel can (i) be set larger than the increase in the film thickness ha of the intermediate layer 9a when the number of drops of ink dripped in the blue sub-pixel is increased by n drops, and (ii) be set smaller than the increase in the film thickness ha of the intermediate layer 9a when the number of drops of ink is increased by n+1 drops.

(4) Portion of the Intermediate Layer 9 that Enters into the Concavity 15

As shown in FIGS. 8B and 8C, the film thickness of the intermediate layer 9 in the concavity 15 is generally thicker than the film thickness of the intermediate layer 9 in the sub-pixel. This is mainly due to ink that fills the concavity 15.

In the lower half of FIG. 7, the amount (volume) v3 of the intermediate layer 9 that enters the concavity 15 indicates the volume of the portion between lines E and F. Therefore, to be precise, the volume of the intermediate layer 9 that enters the concavity 15 is expressed as the amount of the intermediate layer 9 that is formed in the same region as the concavity 15 in plan view.

Returning to FIGS. 8B and 8C, the amount (volume) v3 of the intermediate layer 9 that enters the concavity 15 is the sum of volumes v1 and v2. The volume v1 is the volume of a first portion 42 formed when a first ink portion 41 (volume V1) that fills the concavity 15 dries, and the volume v2 is the volume of a second portion 44 formed when a second ink portion 43 (volume V2) of the ink layer located above the concavity 15 dries.

$$v3 = v1 + v2 \quad (3\text{-}1)$$

The volumes v1 and v2 are represented by the following equations.

$$v1 = N \times V1 \quad (3\text{-}2)$$

$$v2 = N \times V2 \quad (3\text{-}3)$$

As shown in FIGS. 8B and 8C, within the portion of the intermediate layer 9 that enters the concavity 15, the second portion 43, from which the second portion 44 forms, simply changes in accordance with the height H of the ink layer in the sub-pixel, and is considered not to contribute to a change in the film thickness h of the intermediate layer 9. This is also clear from equation (1-5).

Accordingly, within the volume v3 of the intermediate layer 9 that enters the concavity 15, the volume that contributes to a change in the film thickness h of the intermediate layer 9 is the volume v1 of the first portion 42. By adjusting the volume V1 of the concavity 15, the volume v1 of the first portion 42 can be appropriately adjusted, thereby adjusting the film thickness h of the intermediate layer 9.

Furthermore, by finely adjusting the difference between the volume V1a, V1b, and V1c of the respective first ink portions 41a, 41b, and 41c (note that 41c is omitted from the figures) of the different colors, the difference in the volume v1a, v1b, and v1c of the first portions 42 is appropriately adjusted, thereby finely adjusting the difference in film thickness of the intermediate layers 9a, 9b, 9c in the respective sub-pixels of different colors.

In practice, however, it is difficult to separate the intermediate layer 9 that enters into the concavity 15 into the first portion 42 and the second portion 44. Therefore, based on the amount of the intermediate layer 9 in the sub-pixel, a corresponding volume v2' that corresponds to the volume v2 of the second portion 44 is calculated.

In this context, the height of the second ink portion 43 is the same as the height H of the ink layer 45 in the sub-pixel. Accordingly, letting the size of the upper opening of the concavity 15 be S1, a volume v4 per area S1 of the intermediate layer 9 in the sub-pixel (as indicated by reference number 46) corresponds to the volume v2 of the second portion 44, and thus equals the corresponding volume v2'.

The above volume v4 is calculated by multiplying the film thickness h of the intermediate layer 9 in the sub-pixel by the area S1. Note that a mean film thickness of the intermediate layer 9 in the sub-pixel may be used as the film thickness h. Specifically, the film thickness of the intermediate layer 9 in the sub-pixel may be measured in a plurality of locations, and the mean of the measurements calculated as the film thickness h.

$$\begin{aligned} v2' &= v4 \\ &= h \times S1 \end{aligned} \quad (3\text{-}4)$$

The corresponding volume v2' of the second ink portion 43 is thus obtained, allowing for calculation of a corresponding volume v1' of the first ink portion 41. Note that a corresponding volume v3', corresponding to the total volume v3, may for example be calculated based on a cross-section of the intermediate layer 9 that enters into the concavity 15. Specifically, when a cross-section that includes a central axis of the concavity 15 is obtained, the corresponding volume v3' can be considered to be the volume of a solid of revolution obtained by rotating the cross-sectional shape of the intermediate layer 9 once about the central axis.

$$v1' = v3' - v2'$$
$$= v3' - h \times S1 \qquad (3\text{-}5)$$

Note that ideally, the corresponding volume v1' and the volume v1 obtained by multiplying the volume V1 of the concavity 15a by the solute concentration N are approximately equal (for example, in a range of ±10%).

The size of the upper opening S1 of the concavity 15 is defined in the same way as the size of the upper opening of the contact hole 13, as described below. Specifically, the size of the upper opening S1 may be considered as the area of a circle defined by the diameter of the concavity 15 at a position 10% lower than the highest position along the periphery of the concavity 15.

In the present Embodiment, (i) the first contact hole (13a) is deeper than the second contact hole (13b), and the volume of the former is larger than the volume of the latter (V1a>V1b); (ii) the volume of the first organic functional layer (9a) corresponding to a region above the electrode plate (5a) of the first color (for example, N×V0) is equal to, or an approximation of, the volume of the second organic functional layer (9b) corresponding to a region above the electrode plate (5b) of the second color (for example, N×V0); and (iii) the volume (v3a) of the first organic functional layer that enters into the first concavity (15a) corresponding to the first contact hole is larger than the volume (v3b) of the second organic functional layer that enters into the second concavity (15b) corresponding to the second contact hole, so that the film thickness (ha) of the first organic functional layer is less, in a region other than the first concavity on the electrode plate corresponding the first color (for example, 9a in the blue sub-pixel), than the film thickness (hb) of the second organic functional layer in a region other than the second concavity on the electrode plate corresponding to the second color (for example, 9b in the green sub-pixel).

Furthermore, in the present Embodiment, (i) the first contact hole (13a) is deeper than the second contact hole (13b), and the volume of the former is larger than the volume of the latter (V1a>V1b); and (ii) the difference (v3a−v2a=v1a) between the volume (v3a) of the first organic functional layer (9a) that enters into the first concavity (15a) in the electrode plate (5a) of the first color and the volume (v2a) of a portion of the first organic functional layer corresponding to a portion other than the first concavity in the electrode plate (5a) of the first color (for example, 9a in the blue sub-pixel), the portion having the same width (size of the upper opening S1) in plan view as the first concavity, is larger than (iii) the difference (v3b−v2b=v1b) between the volume (v3b) of the second organic functional layer (9b) that enters into the second concavity (15b) in the electrode plate (5b) of the second color and the volume (v2b) of a portion of the second organic functional layer corresponding to a portion other than the second concavity in the electrode plate (5b) of the second color (for example, 9b in the green sub-pixel), the portion having the same width (size of the upper opening S1) in plan view as the second concavity.

Note that the above volumes in parenthesis v1, v2, and v3 may be the above-described corresponding volumes v1', v2', and v3'.

In the present Embodiment, the intermediate layer 9a in the blue sub-pixel corresponds to the first organic functional layer, the intermediate layer 9b in the green sub-pixel corresponds to the second organic functional layer, and the intermediate layer 9c in the red sub-pixel corresponds to the third organic functional layer.

It may also be considered that the intermediate layer 9a in the blue sub-pixel corresponds to the first organic functional layer, and the intermediate layer 9c in the red sub-pixel corresponds to the second organic functional layer. Furthermore, it may be considered that the intermediate layer 9b in the green sub-pixel corresponds to the first organic functional layer, and the intermediate layer 9c in the red sub-pixel corresponds to the second organic functional layer.

(4) The following is a consideration of a specific, numerical example.

For example, in one sub-pixel, let the size of the ink-spraying region on the anode plate 5 (regions shown by reference numbers 5a-5c in FIG. 3A) be 300 µm long and 70 µm wide, and the area of the ink-spraying region on the anode plate 5 be S=21000 µm².

Furthermore, let the solute concentration N of the ink for the intermediate layer be 0.02 (2 vol %) and the drop amount of one drop of ink ejected by the inkjet be 3 pL, and let seven drops of ink be ejected on the anode plate 5 in each sub-pixel, so that V0, the quantity of ink that fills each ink-spraying region, equals 21 pL (21000 µm³).

If there is no concavity in the anode plate 5, the hypothetical height H0 of the ink layer on the anode plate 5 is V0/S=1 µm (=1000 nm), and the film thickness h0 of the intermediate layer 9 that forms after drying is obtained by the following equation.

$$h0 = N \times H0 \qquad (4\text{-}1)$$
$$= 0.02 \text{ µm}$$
$$= 20 \text{ nm}$$

The concavity 15a corresponding to the color blue is a circular truncated cone in which the upper radius is larger than the lower radius. The height T is set to 6 µm, the upper radius r1 to 18 µm, the lower radius r2 to approximately 14.5 µm, and the inclination angle of the side walls (inclination angle with respect to the X-Y plane) to 60°. Accordingly, the volume V1a of the concavity 15a is 4994 µm³ (4.994 pL), as obtained by the following equation, with a value of 3.14 used for π.

$$V1 = \pi \times T(r_1^2 + r_1 \times r_2 + r_2^2)/3 \qquad (4\text{-}2)$$

As a result, the film thickness ha of the intermediate layer 9a in the blue sub-pixel is obtained by the following equation.

$$ha = N(V0 - V1a)/S = 15.2 \text{ nm} \qquad (4\text{-}3)$$

Similarly, the concavity 15b corresponding to the color green is a circular truncated cone in which the upper radius is larger than the lower radius. The height T is set to 4.5 µm, the upper radius to 18 µm, the lower radius to approximately 15.4 µm, and the inclination angle of the side walls (inclination angle with respect to the X-Y plane) to 60°. Accordingly, the volume V1b of the concavity 15b is 3949 µm³ (3.949 pL), with a value of 3.14 used for π.

As a result, the film thickness hb of the intermediate layer 9b in the green sub-pixel is obtained by the following equation.

$$hb = N(V0 - V1b)/S = 16.2 \text{ nm} \qquad (4\text{-}4)$$

Similarly, the concavity 15c corresponding to the color red is a circular truncated cone in which the upper radius is larger than the lower radius. The height T is set to 3 µm, the upper radius to 18 µm, the lower radius to approximately 16.3 µm, and the inclination angle of the side walls (inclination angle with respect to the X-Y plane) to 60°. Accordingly, the volume V1c of the concavity 15c is 2773 µm³ (2.773 pL). As a result, the film thickness hc of the intermediate layer 9c in the red sub-pixel is obtained by the following equation.

$$hc = N(V0 - V1c)/S = 17.4 \text{ nm} \quad (4\text{-}5)$$

Accordingly, the difference in film thickness Δhab between the film thickness ha of the intermediate layer 9a in the blue sub-pixel and the film thickness hb of the intermediate layer 9b in the green sub-pixel is 1.0 nm. The difference in film thickness Δhbc between the film thickness hb and the film thickness hc is approximately 1.1 nm. Furthermore, the difference in film thickness Δhac between the film thickness ha and the film thickness hc is approximately 2.1 nm. In the above case, the difference in volume ΔV1 of the contact holes 13 is as follows: ΔV1ab (the difference between blue and green) and ΔV1bc (the difference between green and red) is approximately 1045 µm³ (approximately 1 pL), and ΔV1ac (the difference between blue and red) is approximately 2221 µm³ (approximately 2 pL).

The difference in film thickness of the intermediate layer 9 between sub-pixels of different colors can thus be adjusted in fine increments (for example, equal to or less than 1 nm).

On the other hand, in the comparative example, when the number of drops of ink that are dripped into each sub-pixel in a comparative example is increased or decreased by one drop, the film thickness of the intermediate layer that forms increases or decreases by 2.9 nm. Therefore, adjustments to the film thickness can only be made in 2.9 nm increments. Note that the above value of 2.9 nm changes depending on the volume of one drop of ink ejected from the inkjet apparatus and on the area of the ink-spraying region.

As described above, the method of manufacturing the display panel 100 according to the present embodiment allows for the difference in film thickness of the intermediate layer 9 between sub-pixels of different colors to be finely adjusted relatively easily by adjusting the volume of the concavities 15a, 15b, and 15c formed in the sub-pixels of different colors in finer increments than the volume of a drop of ink. As a result, the film thickness of the intermediate layer 9 in each sub-pixel can easily be set to a value that matches the wavelength of the luminescent color in the sub-pixel, thus improving light-extraction efficiency.

Note that in the above calculation example, the inclination angle (taper angle) of the side wall of the contact hole 13 is set to 60°, but the inclination angle is not limited in this way, and may be set to any angle. Furthermore, the above contact holes 13 are described as continuously becoming more narrow, but the contact holes may be of any shape.

The above difference in film thickness Δh is not limited to 1 nm or 2 nm, but in response to conditions may be set, for example, to less than 1 nm, or at least 3 nm. The upper radius of the contact hole 13 is not limited to 18 µm, but may be set to any value, for example at least 20 µm.

So as not to influence the height or shape of the banks 8, it is preferable for the opening at the top of the contact hole 13 to be formed in a region that is separated from the banks 8 in plan view.

It is preferable that the difference in volume ΔV1 between contact holes 13 corresponding to different colors be larger than the tolerance of the volume of the contact hole 13a. For example, if the volume of the contact hole 13a is 5000 µm³, and the tolerance is 10%, it is preferable for the difference in volume ΔV1ab to exceed 500 µm³.

(Regarding the Size of the Upper Opening)

The following describes the size of the upper opening of the contact hole 13.

In the present Embodiment, the size of the upper opening of each of the contact holes 13a, 13b, and 13c is set to be substantially equal. The size of the upper opening of the contact holes 13 is the area of a circle defined by the diameter of the contact hole 13 at a position 10% lower than the highest position along the periphery of the contact hole 13.

FIGS. 9A, 9B, and 9C schematically show cross-sections of the contact holes 13 (note that cross-sections of the contact hole 13b are shown as representative examples). In each of the figures, the shape of the periphery of the contact hole 13 differs. The following describes how the diameter of the contact hole 13 is defined in these cases.

First of all, the "highest position along the periphery of the contact hole 13" and the "depth of the contact hole 13" are described.

In FIG. 9A, the highest position along the periphery of the contact hole 13 is the same height as the upper surface 50 of the interlayer insulation film 3 (line O1). In this case, the depth P1 of the contact hole 13 is the perpendicular distance between the upper surface 50 and the bottom of the contact hole 13 (upper surface of the SD electrode 22). The perpendicular distance is the distance in the lamination direction (the Z direction).

In FIG. 9B, the edge of the opening of the contact hole 13 is a curve 51. In this case, the curve 51 can be considered as forming part of the periphery of the contact hole 13, with the highest position along the curve 51 being the height of the upper surface 50 of the interlayer insulation film 3. In this case, the depth P2 of the contact hole 13 is the same as in FIG. 9A.

In FIG. 9C, a protrusion 52 is formed next to the contact hole 13. As shown in the figure, if the side wall 53 of the protrusion 52 is considered to be part of the side wall of the contact hole 13, the position of the top 54 of the protrusion 52 corresponds to the highest position along the periphery of the contact hole 13. In this case, the depth P3 of the contact hole 13 is the perpendicular distance between the top 54 of the protrusion 52 and the bottom of the contact hole 13.

In the present Embodiment, however, the depth of the contact holes 13a, 13b, and 13c differs by color. In this case, the average depth $P_{Ave}$ of the three contact holes 13a, 13b, 13c is used as the depth of the contact hole 13.

Next, "a position 10% lower than the highest position along the periphery of the contact hole 13" and the "diameter of the contact hole 13" are described.

A position 10% lower than the highest position refers to a position that is lower than the highest position by approximately 10% of the average depth $P_{Ave}$. Note that approximately 10% refers to a value in a range with a tolerance of ±1%, i.e. 9% or greater and 11% or less.

In FIGS. 9A, 9B, and 9C, the lines Q1, Q2, and Q3 indicate positions that are lower than the positions O1, O2, and O3, the highest positions along the periphery of the contact hole 13, by 10% of the average depth $P_{Ave}$.

In each cross-section, the distance between the two points where the line Q1, Q2, or Q3 intersects with the sides of the contact hole 13 is the diameter φ1, φ2, or φ3 of the contact hole 13. As a result, the size of the upper opening of the contact hole 13 is, for example, the area of a circle with diameter φ1.

(Regarding Optical Path Length)

Figure 10:
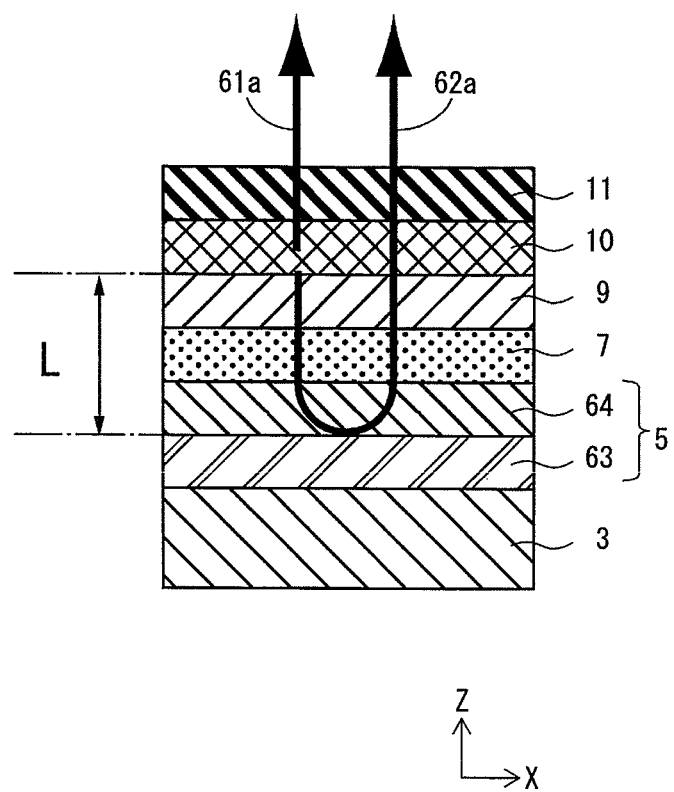
FIG. 10 is a schematic diagram illustrating the progression of light in an organic light-emitting element 20.

FIG. 10 is a cross-section diagram schematically showing a path of light in the organic light-emitting element 20. FIG. 10 shows directly released light 61, which is emitted directly from the light-emitting layer 10 towards the cathode layer 11, and reflected light 62, which is released after being reflected at the anode plate 5. Note that in FIG. 10, the anode plate 5 is shown divided into a metal layer 63 and a transparent electrode layer 64 (IZO). In this case, the reflective surface of the anode plate 5 is the main surface of the metal layer 63 at the side of the transparent electrode layer 64.

In FIG. 10, the resonance condition of light in the organic light-emitting element 20 can be optimized for the optical path length of, for example, the intermediate layer 9, hole-injection layer 7, and transparent electrode layer 64. This structure is referred to as a cavity, or a cavity structure.

In the present Embodiment, the difference in path length may be adjusted either by changing only the film thickness of the intermediate layer 9, or by additionally adjusting the film thickness of the hole-injection layer 7, the transparent electrode layer 64, etc.

The following is a simple description of a method for determining the difference in volume between contact holes. For example, a prototype of an organic light-emitting display panel is manufactured, and in order to optimize the resonance condition of light for each color, it is determined how to change the difference in film thickness between the organic functional layer of each color, or whether to change the overall film thickness while maintaining the difference in film thickness between organic functional layers. An organic light-emitting display panel is then manufactured under the same conditions (ink spraying conditions) as the prototype, changing the volume of the contact holes. The resonance conditions of light in the organic light-emitting elements are thus optimized, yielding an organic light-emitting display panel with high luminous efficiency.

<Modification>

In Embodiment 1, the difference in film thickness between the intermediate layers 9 is finely adjusted by changing the volume of the contact hole 13 corresponding to each color, but the difference in film thickness between the light-emitting layers 10, which are an example of an organic functional layer, may also be finely adjusted.

In the present modification, a difference in volume between the contact holes 13a, 13b, and 13c leads to a difference in film thickness between the light-emitting layers 10a, 10b, and 10c of the sub-pixels of different colors. As a result, it is easier to achieve appropriate brightness and chromaticity for the light-emitting layer 10 of each color. The resonance conditions of light in the organic light-emitting element 20 are also appropriately adjusted, thus improving light-extraction efficiency. Note that the number of drops of ink, which includes organic light-emitting material, that are sprayed in the sub-pixel of each color may first be varied, and then the difference in film thickness may further be finely adjusted by a difference in volume between the contact holes 13.

In the present modification, intermediate layers may be formed by the vacuum deposition method or the sputtering method. The intermediate layers may also be formed by the inkjet method, or the intermediate layers may be omitted.

When forming hole-injection layers by the inkjet method, the difference in the film thickness thereof may be finely adjusted. In this case, an organic material such as PEDOT-PSS, an aromatic amine series high-polymer material, polyphenylene vinylene, etc. may be used as the material for the hole-injection layer.

Embodiment 2

In Embodiment 1, the depth of the contact holes 13 is changed by forming levels in the interlayer insulation film 3. Alternatively, the upper surface of the interlayer insulation film may be planarized, and the height of the upper surface of the substrate where the contact hole corresponding to each color is to be formed may be changed in order to change the film thickness of the interlayer insulation film and to change the depth of the contact holes.

Figure 11:
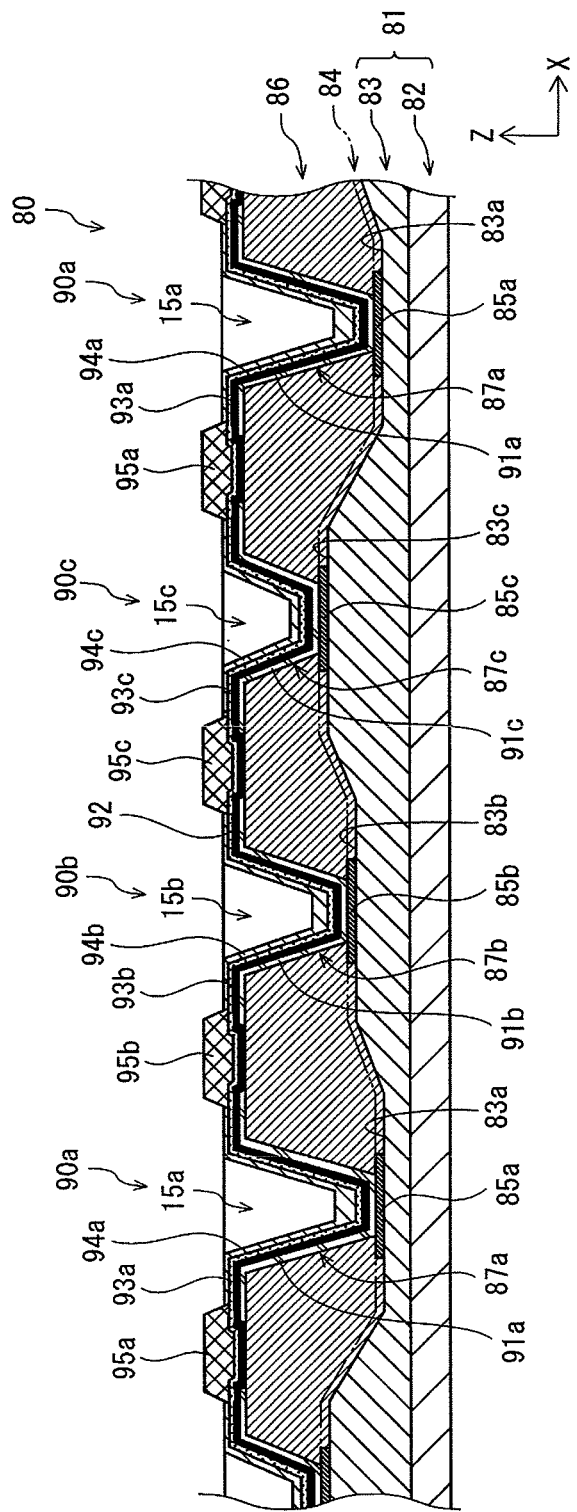
FIG. 11 is a cross-section diagram showing the structure of a display panel according to Embodiment 2.

FIG. 11 is a cross-section diagram schematically showing a display panel 80 according to the present Embodiment. FIG. 11 shows a cross-section corresponding to the cross section A-A' of FIG. 3A. Note that the light-emitting layer, cathode layer, etc. are omitted from FIG. 11.

In the present Embodiment, the structure shown in FIGS. 3A and 3C of Embodiment 1 is basically adopted. However, the cross-sectional shape of the substrate and of the interlayer insulation film differs. Note that the same reference numbers are used for the concavities 15 as in Embodiment 1.

Steps are formed in a stepped substrate 81 in the present Embodiment. A planar substrate 82 and a stepped portion 83 are layered to form the stepped substrate 81.

A TFT layer 84 (shown schematically by a line with alternate long and two short dashes) is formed on the stepped substrate 81, and SD electrodes 85 in each TFT included in the TFT layer 84 are representatively shown.

An interlayer insulation film 86 is formed on the TFT layer 84. In the interlayer insulation film 86, above each SD electrode 85, a contact hole 87 is formed to have substantially the same size of the upper opening as the SD electrode 85. The upper surface 86a of the interlayer insulation film 86 is level, except for where the contact hole 87 is formed.

On the interlayer insulation film 86, organic light-emitting elements 90a, 90b, and 90c, respectively corresponding to blue, green, and red, are formed. In each organic light-emitting element 90, an anode plate 91, pixel defining layer 92, hole-injection layer 93, and intermediate layer 94 are layered in this order. Organic light-emitting elements 90 that neighbor each other along the X axis are partitioned by banks 95.

The planar substrate 82 forming the lower part of the stepped substrate 81 may be the same as the substrate 1 in Embodiment 1.

The stepped portion 83 forming the upper part of the stepped substrate 81 is level along the bottom surface thereof (the main surface at the side of the planar substrate 82) and is stepped along the upper surface. In the stepped portion 83, the film thickness is uniform along the Y axis and changes stepwise along the X axis.

The upper surface of the stepped portion 83 includes a first surface 83a of a lowest step, a second surface 83b of an intermediate step, and a third surface 83c. The spaces between the three surfaces are slanted. Furthermore, the first surface 83a, second surface 83b, and third surface 83c (hereinafter, abbreviated as "the first surface 83a, etc.") are formed to be parallel to the main surface of the planar substrate 82, thus forming a strip-like planar shape extending along the Y axis.

Furthermore, the first surface 83a, etc. correspond to the different color organic light-emitting elements 90. On the first surface 83a, an SD electrode 85a for an organic light-emitting element 90a corresponding to the color blue is formed. On the second surface 83b, an SD electrode 85b for an organic light-emitting element 90b corresponding to the color green is formed. On the third surface 83c, an SD electrode 85c for an organic light-emitting element 90c corresponding to the color red is formed.

As a result, the height of the upper surface of the SD electrodes 85 is as follows: the SD electrode 85*a* is the lowest, the SD electrode 85*b* is an intermediate height, and the SD electrode 85*c* is the highest.

Accordingly, the depth of the contact holes 87 formed on the SD electrodes is as follows: a contact hole 87*a* formed on the SD electrode 85*a* is the deepest, a contact hole 87*b* formed on the SD electrode 85*b* is an intermediate depth, and a contact hole 87*c* formed on the SD electrode 85*c* is the least deep.

Since the size of the upper opening is substantially the same in the contact holes 87*a*, 87*b*, and 87*c*, the volume of each of the contact holes 87 increases as the depth thereof increases.

By finely adjusting the difference in volume between the contact holes 87*a*, 87*b*, and 87*c* for the respective colors, the difference in film thickness between the intermediate layers 94 formed by the inkjet method is finely adjusted, as in Embodiment 1. A difference in film thickness appropriate for the wavelength of each color of light is thus achieved.

In the present Embodiment, the "locations corresponding to the bottom of the first, second, and third contact holes in the TFT substrate" are above the SD electrodes 85*a*, 85*b*, and 85*c* and correspond to the lower part of the interlayer insulation film. The upper surface of the SD electrodes 85*a*, 85*b*, and 85*c* can also be thought of as forming the "bottom of each of the first, second, and third contact holes in the TFT substrate".

(Method of Manufacturing Display Panel)

First, a glass planar substrate 82, for example, is prepared.

Formation of Stepped Surface

FIGS. 12A, 12B, and 12C are cross-section diagrams schematically showing a formation process of the stepped surface.

An inorganic insulation film 96 (silicon oxide, silicon nitride, etc.) is formed by the CVD method, for example, on the planar substrate 82 (FIG. 12A).

The upper part of the inorganic insulation film 96 is etched by photolithography to form steps (FIGS. 12B, 12C).

Specifically, a first photoresist film is formed on the inorganic insulation film 96 and then exposed to light and developed, thus forming openings in portions of the first photoresist film over regions where the first surface 83*a* and second surface 83*b* are to be formed. The regions of the inorganic insulation film 96 exposed through the first photoresist film are then etched to the depth of the second surface 83*b* (for example, by wet etching). Through this process, the height of the regions in the inorganic insulation film 96 where the first surface 83*a* and the second surface 83*b* are formed become lower than the third surface 83*c* (FIG. 12B). Furthermore, this process forms the second surface 83*b*.

Next, after the first photoresist film is removed, a second film is newly formed and then exposed to light and developed, thus forming openings in portions of the second photoresist film over regions where the first surface 83*a* is to be formed. The regions of the inorganic insulation film 96 exposed through the second resist film are then etched to the depth of the first surface 83*a*. This process forms the first surface 83*a* (FIG. 12C).

The stepped portion 83 is formed through the above processes to manufacture the stepped substrate 81.

Note that steps may also be formed on the planar substrate 82 by etching the planar substrate 82, without forming an inorganic insulation film 96 thereon.

Furthermore, the inorganic insulation film 96 may be formed from a photosensitive resin material.

In this case, photolithography may for example be used as in the interlayer insulation film formation process in Embodiment 1, exposing an insulation film using a multi-tone mask and then removing the light-sensitive (or non light-sensitive) portion of the insulation film by developing to form the stepped surface.

In such a multi-tone mask, the transparent portion corresponds to a region in which the first surface 83*a* is formed, the semi-transparent portion corresponds to a region in which the second surface 83*b* is formed, and the transparent portion corresponds to a region in which the third surface 83*c* is formed.

Formation of TFT Layer

A known method of manufacturing (for example, as recited in Japanese Patent Application Publication No. 2003-241683 or Japanese Patent Application Publication No. 2008-300611) is used to form the TFT layer 84, which includes TFTs, wiring lines, and SD electrodes 22, on the stepped portion 83 (FIG. 4A). The TFTs may be inorganic or organic.

Note that when the stepped portion 83 is formed from resin material, it is preferable for the TFTs to be organic.

Formation of Interlayer Insulation Film

A resist film formed by positive photosensitive organic material is first applied to the TFT layer 84, and contact holes 90 are then formed at locations above the SD electrodes 22 in the resist film.

The resist film is applied by a liquid film formation method such as spin coating. The surface of the TFT layer 84 is planarized by filling in surface irregularities.

Photolithography is used to form the contact holes 13. For example, a monotone mask is used, and portions of the resist film corresponding to regions where the contact holes 90 are to be formed are exposed to light. The exposed portions are removed by developing to contact holes 90 that penetrate the resist film. The resist film with the contact holes 90 formed therein becomes the interlayer insulation film 86.

Subsequent processes are the same as in Embodiment 1, and therefore a description thereof is omitted.

In the present Embodiment, the upper surface of the interlayer insulation film 86 is level, and the regions in which the anode plates 91 of the differing colors are formed are a uniform height. This allows for the anode plate 91, pixel defining layer 92, hole-injection layer 93, etc. to be formed easily.

In the present Embodiment, within the upper surface of the interlayer insulation film 86, (i) the portion formed on the first surface 83*a* (portion in which the anode plate 91*a* is formed) corresponds to the location where the first electrode plate group is formed, (ii) the portion formed on the second surface 83*b* (portion in which the anode plate 91*b* is formed) corresponds to the location where the second electrode plate group is formed, and (iii) the portion formed on the third surface 83*c* (portion in which the anode plate 91*c* is formed) corresponds to the location where the third electrode plate group is formed.

Note that the section above the second surface 83*b* may also be considered to correspond to the location where the first electrode plate group is formed, and the section above the third surface 83*c* may also be considered to correspond to the location where the second electrode plate group is formed. Furthermore, the section above the first surface 83*a* may also be considered to correspond to the location where the first electrode plate group is formed, and the section above the third surface 83*c* may also be considered to correspond to the location where the second electrode plate group is formed.

In the present Embodiment, the portions where the anode plates 91*a*, 91*b*, and 91*c* are formed on the upper surface of the interlayer insulation film 86 are substantially equal (excluding the portions where the contact holes are formed). Specifically, within the upper surface of the interlayer insulation film 86, the difference between the height of the portion where the anode plate 91a is formed and the height of the portion where the anode plate 91c is formed is within 5% of the difference between the depth of the first contact hole 87a and the depth of the third contact hole 87c. Note that the depth of the contact holes is determined by the depths P1 through P3, as exemplified in FIG. 9.

1. Example of Structure of Display Device

Figure 13:
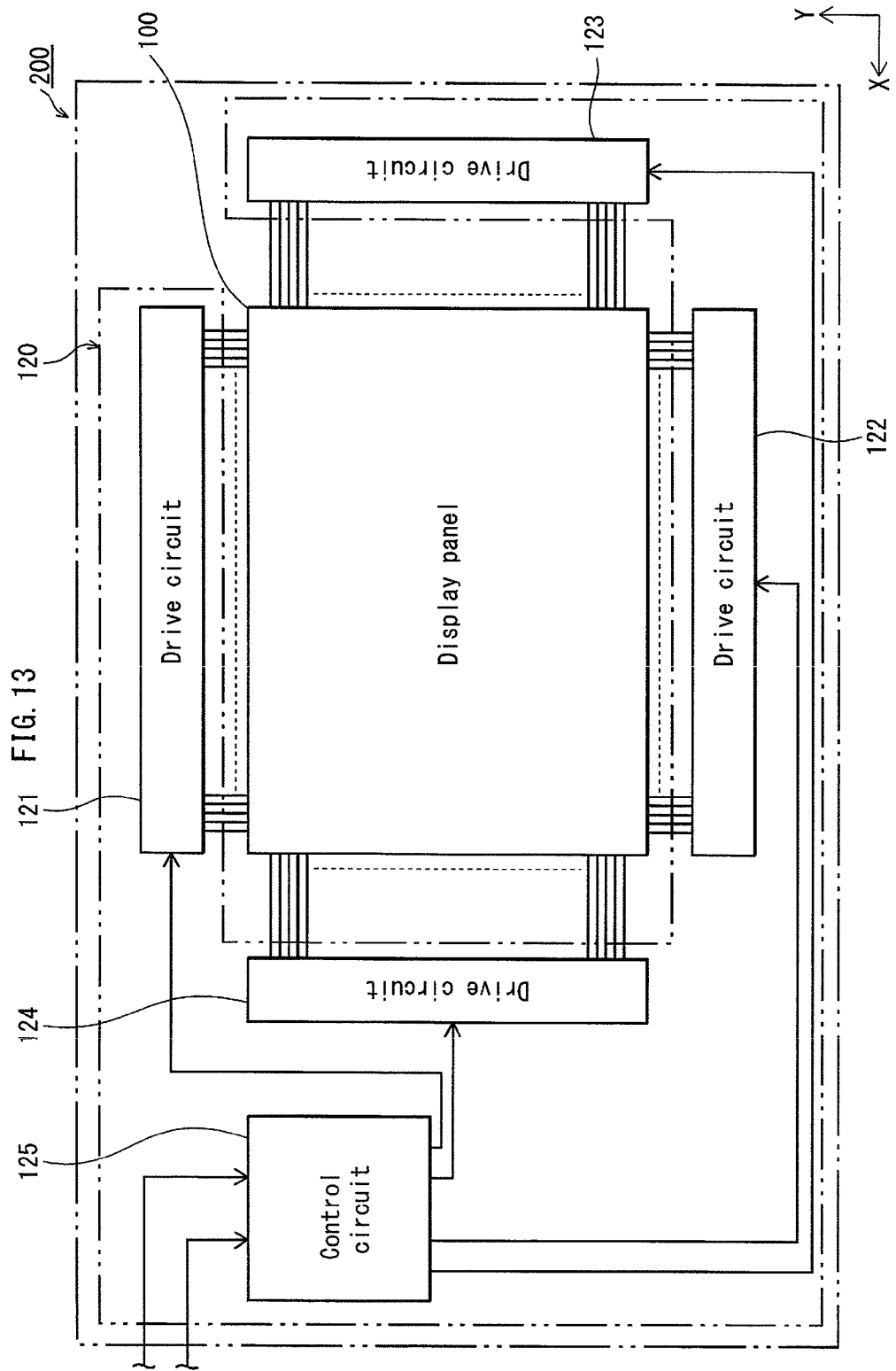
FIG. 13 is a diagram showing the overall structure of a display device 200 according to the Embodiments.

FIG. 13 shows the structure of a display device 200 provided with the display panel 100.

Figure 14:
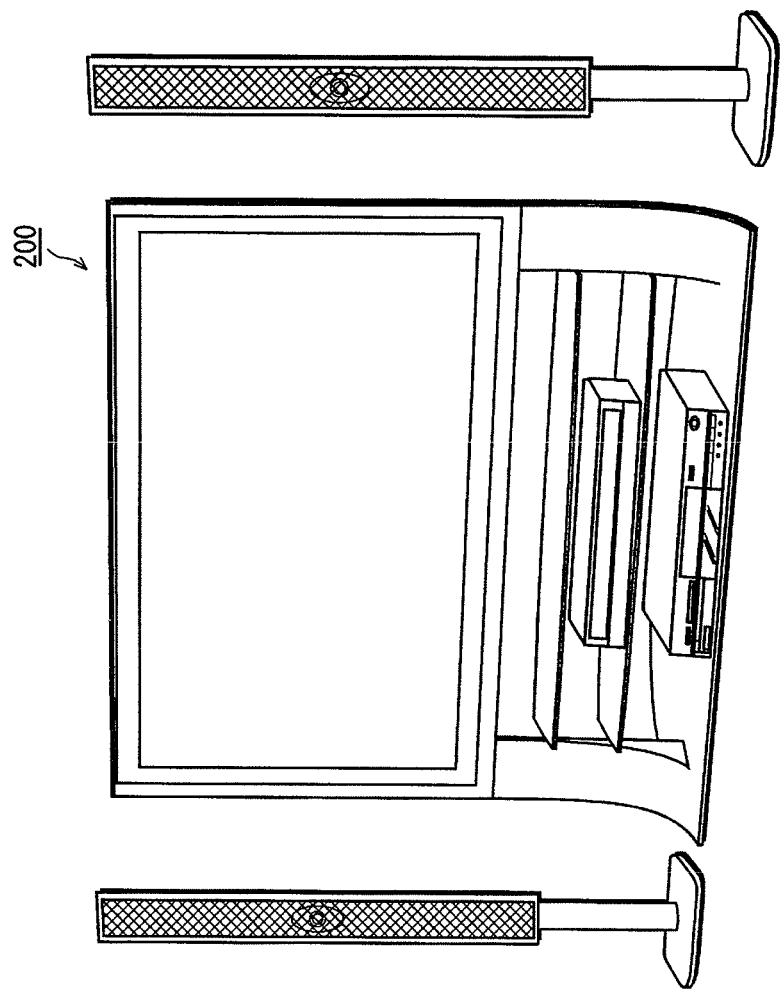
FIG. 14 is an appearance profile of an example of a television system that includes the display device 200.

FIG. 14 is an appearance profile of an example of a television system that includes the display device 200.

The display device 200 includes an organic light-emitting display panel 100 and a drive control unit 120 connected thereto. The drive control unit 120 is composed of four drive circuits 121-124 and a control circuit 125. A power supply unit, not shown in the figures, supplies the drive control unit 120 with power.

The TFT layer 2 is provided with signal wiring lines corresponding to each column and scanning wiring lines corresponding to each row of the matrix of organic light-emitting elements 20. The signal wiring lines extend in the direction of the Y axis, are connected to each least one of the drive circuit 121 and the drive circuit 122, and are connected to the TFTs of the organic light-emitting elements 20 in each column. The scanning wiring lines extend in the direction of the X axis, are connected to each least one of the drive circuit 123 and the drive circuit 124, and are connected to the TFTs of the organic light-emitting elements 20 in each row.

2. In the above Embodiments and modification, structures are adopted by way of example in order to clearly illustrate a structure of the present invention and the effects and advantages thereof. Except for its essential elements, the present invention is not limited to the above structures. For example, in the above Embodiments, as shown in FIG. 1, a structure is adopted by way of example in which anode plates 5 are located below the light-emitting layer 10 in the direction of the Z axis. The present invention is not limited, however, to this structure; a structure may be adopted in which cathodes are located below the organic light-emitting layer 10 in the direction of the Z axis.

3. In the above Embodiments and modification, a top-emission structure may be adopted, wherein the anode plates 5 are a reflective metal, and the cathode layer 11a transparent or semi-transparent metal. Alternatively, a bottom-emission structure may be adopted, wherein the anode plates 5 are a transparent or semi-transparent metal, and the cathode layer 11a reflective metal.

4. In the above Embodiments and modification, use of active matrix driving with the TFT layer 2 on the substrate is assumed, but the present invention is also applicable to passive matrix driving. In this case, no TFT layer is necessary, and current can be provided to the organic light-emitting layer by driving lines that drive the organic light-emitting layer.

5. In the above Embodiments and modification, the pixel defining layer 6 is formed between the anode plate 5 and the hole-injection layer 7, but alternatively the pixel defining layer 6 may be formed above the hole-injection layer 7.

6. The above Embodiments describe an example in which the intermediate layer is formed on the anode plate 5 as an organic functional layer by the wet method. However, when a hole-injection layer, or a hole injection and transporting layer, is formed as an organic functional layer by the wet method, the film thickness of the organic functional layer may similarly be finely adjusted to efficiently yield light of each luminescent color.

7. In the above Embodiments and modification, when the intermediate layer 9 and the light-emitting layer 10 are both sprayed by the inkjet method, the difference in film thickness between sub-pixels of different colors may be adjusted by adjusting both the intermediate layer 9 and the light-emitting layer 10.

INDUSTRIAL APPLICABILITY

The organic light-emitting display panel according to the present invention can be used as a display in electronic devices such as cellular phones, televisions, etc.

What is claimed is:

1. An organic light-emitting display panel, comprising:
a thin-film transistor layer;
an interlayer insulation film above the thin-film transistor layer;
a first electrode plate group in a first line on the interlayer insulation film and including a plurality of first electrode plates that correspond to a first color, the first electrode plate group defining a first longitudinal edge and a second longitudinal edge that each extend along the first line;
a second electrode plate group in a second line on the interlayer insulation film adjacent to the first electrode plate group and including a plurality of second electrode plates that correspond to a second color, the second electrode plate group defining a third longitudinal edge and a fourth longitudinal edge that each extend along the second line;
a first bank along the first longitudinal edge of the first electrode plate group;
a second bank between the second longitudinal edge of the first electrode plate group and the third longitudinal edge of the second electrode plate group;
a third bank along the fourth longitudinal edge of the second electrode plate group;
a first organic functional layer between the first bank and the second bank and above the first electrode plate group;
a second organic functional layer between the second bank and the third bank and above the second electrode plate group; and
a counter electrode covering the first organic functional layer and the second organic functional layer, wherein
the interlayer insulation film includes first contact holes and second contact holes, the plurality of first electrode plates each connected with the thin-film transistor layer via one of the first contact holes, the plurality of second electrode plates each connected with the thin-film transistor layer via one of the second contact holes,
each of the plurality of first electrode plates includes a first concavity shaped in conformity with a corresponding one of the first contact holes for connecting with the thin-film transistor layer, and each of the plurality of second electrode plates includes a second concavity shaped in conformity with a corresponding one of the second contact holes for connecting with the thin-film transistor layer,
the interlayer insulation film includes a first thickness below the first electrode plate group that is greater than a second thickness of the interlayer insulation film below the second electrode plate group,
each of the first contact holes includes a first depth that is greater than a second depth of each of the second contact holes and a first volume that is greater than a second volume of each of the second contact holes,
a third volume of a first portion of the first organic functional layer above each of the plurality of first electrode plates is substantially equal to a fourth volume of a second portion of the second organic functional layer above each of the plurality of second electrode plates, and a first amount of the first organic functional layer is in the first concavity and greater than a second amount of the second organic functional layer that is in the second concavity, so that a first film thickness of the first organic functional layer in a first region other than above the first concavity in each of the plurality of first electrode plates is less than a second film thickness of the second organic functional layer in a second region other than above the second concavity in each of the plurality of second electrode plates.

2. The organic light-emitting display panel of claim 1, wherein a first size of a first upper opening of each of the first contact holes is substantially equal to a second size of a second upper opening of each of the second contact holes.

3. The organic light-emitting display panel of claim 2, wherein the first size and the second size each equal an area of a circle defined by a diameter of a corresponding one of the first contact holes and the second contact holes at a position substantially 10% lower than a height of a highest position of the interlayer insulation film along a periphery of the corresponding one of the first contact holes and the second contact holes.

4. The organic light-emitting display panel of claim 1, further comprising:

a first pixel defining layer covering the first concavity of each of the plurality of first electrode plates; and a second pixel defining layer covering the second concavity of each of the plurality of second electrode plates, wherein the first organic functional layer is above the first pixel defining layer; and the second organic functional layer is above the second pixel defining layer.

5. The organic light-emitting display panel of claim 1, wherein the first organic functional layer is continuous above the first electrode plate group due to first ink drops of a predetermined volume being sprayed via an inkjet method, the second organic functional layer is continuous above the second electrode plate group due to second ink drops of substantially the predetermined volume being sprayed via the inkjet method, and the first volume of the first portion of the first organic functional layer above each of the plurality of first electrode plates is substantially equal to the second volume of the second portion of the second organic functional layer above each of the plurality of second electrode plates.

6. The organic light-emitting display panel of claim 5, wherein a difference between the first film thickness of the first organic functional layer and the second film thickness of the second organic functional layer is larger than a first additional film thickness of the first organic functional layer when a number of ink drops of the predetermined volume sprayed on each of the plurality of first electrode plates via the inkjet method is increased by n drops, and smaller than a second additional film thickness of the first organic functional layer when the number of ink drops is increased by n+1 drops.

7. The organic light-emitting display panel of claim 1, wherein the first color is blue.

8. The organic light-emitting display panel of claim 1, wherein a first upper surface of the interlayer insulation film below the first electrode plate group is higher than a second upper surface of the interlayer insulation film below the second electrode plate group, and a first height of the thin-film transistor layer below the first contact holes is substantially equal to a second height of the thin-film transistor layer below the second contact holes.

9. The organic light-emitting display panel of claim 1, wherein a first height of an upper surface of the interlayer insulation film below the first electrode plate group is substantially equal to a second height of the upper surface of the interlayer insulation film below the second electrode plate group, and the thin-film transistor layer is lower below the first contact holes than below the second contact holes.

10. The organic light-emitting display panel of claim 1, further comprising:

a third electrode plate group in a third line on the interlayer insulation film adjacent to the second electrode plate group and including a plurality of third electrode plates that correspond to a third color, the third electrode plate group defining a fifth longitudinal edge that extends along the third line opposite the second electrode plate group;

a fourth bank along the fifth longitudinal edge of the third electrode plate group; and a third organic functional layer between the third bank and the fourth bank and above the third electrode plate group, wherein the counter electrode covers the third organic functional layer, the interlayer insulation film includes third contact holes, the plurality of third electrode plates each connected with the thin-film transistor layer via one of the third contact holes, each of the plurality of third electrode plates includes a third concavity shaped in conformity with a corresponding one of the third contact holes for connecting the with the thin-film transistor layer, the first thickness of the interlayer insulation film below the first electrode plate group is greater than a third thickness of the interlayer insulation film below the third electrode plate group, the first depth of each of the first contact holes is greater than a third depth of each of the third contact holes and the first volume of each of the first contact hole is greater than a fifth volume of each of the third contact holes, the third volume of the first portion of the first organic functional layer above each of the plurality of first electrode plates is substantially equal to a sixth volume of a third portion of the third organic functional layer above each of the plurality of third electrode plates, and the first amount of the first organic functional layer that is in the first concavity is greater than a third amount of the third organic functional layer that is in the third concavity, so that the first film thickness of the first organic functional layer in the first region other than above the first concavity in each of the plurality of first electrode plates is less than a third film thickness of the third organic functional layer in a third region other than above the third concavity in each of the plurality of third electrode plates.

11. The organic light-emitting display panel of claim 10, wherein
a first size of a first upper opening of each of the first contact holes, a second size of a second upper opening of each of the second contact holes, and a third size of a third upper opening of each of the third contact holes are substantially equal.

12. The organic light-emitting display panel of claim 11, wherein
the first size, the second size, and the third size each substantially equal an area of a circle defined by a diameter of a corresponding one of the first contact holes, the second contact holes, and the third contact holes at a position substantially 10% lower than a height of a highest position of the interlayer insulation film along a periphery of the corresponding one of the first contact holes, the second contact holes, and the third contact holes.

13. The organic light-emitting display panel of claim 10, wherein
a first upper surface of the interlayer insulation film below the first electrode plate group is higher than both a second upper surface of the interlayer insulation film below the second electrode plate group and a third upper surface of the interlayer insulation film below the third electrode plate group, and
a first height of the thin-film transistor layer below the first contact holes, a second height of the thin-film transistor layer below the second contact holes, and a third height of the thin-film transistor layer below the third contact holes are substantially equal.

14. The organic light-emitting display panel of claim 10, wherein
a first height of an upper surface of the interlayer insulation film below the first electrode plate group, a second height of the upper surface of the interlayer insulation film below the second electrode plate group, and a third height of the upper surface of the interlayer insulation film below the third electrode plate group are substantially equal, and
the thin-film transistor layer is lower below the first contact holes than both below the second contact holes and below the third contact holes.

15. The organic light-emitting display panel of claim 10, wherein
the first organic functional layer, the second organic functional layer, and the third organic functional layer are each an organic light-emitting layer.

16. The organic light-emitting display panel of claim 10, wherein
the first organic functional layer, the second organic functional layer, and the third organic functional layer are all one of a charge injection layer and a charge transport layer,
a first organic light-emitting layer is between the first organic functional layer and the counter electrode,
a second organic light-emitting layer is between the second organic functional layer and the counter electrode, and
a third organic light-emitting layer is between the third organic functional layer and the counter electrode.

17. The organic light-emitting display panel of claim 1, wherein
the first organic functional layer and the second organic functional layer are each an organic light-emitting layer.

18. The organic light-emitting display panel of claim 1, wherein
the first organic functional layer and the second organic functional layer are both one of a charge injection layer and a charge transport layer,
a first organic light-emitting layer is between the first organic functional layer and the counter electrode, and
a second organic light-emitting layer is between the second organic functional layer and the counter electrode.

19. The organic light-emitting display panel of claim 1, wherein
the plurality of first electrode plates and the plurality of second electrode plates are anodes, and the counter electrode is a cathode.

20. The organic light-emitting display panel of claim 1, wherein
the plurality of first electrode plates and the plurality of second electrode plates are cathodes, and the counter electrode is an anode.

21. A display device comprising the organic light-emitting display panel of claim 1.

22. A method of manufacturing an organic light-emitting display panel, comprising:
preparing a substrate;
forming a thin-film transistor layer on the substrate;
forming an interlayer insulation film on the thin-film transistor layer;
forming, on the interlayer insulation film in a first line, a first electrode plate group that includes a plurality of first electrode plates that correspond to a first color and, on the interlayer insulation film in a second line, a second electrode plate group that includes a plurality of second electrode plates that correspond to a second color, the first electrode plate group defining a first longitudinal edge and a second longitudinal edge that each extend along the first line, the second electrode plate group defining a third longitudinal edge and a fourth longitudinal edge that each extend along the second line;
forming a first bank along the first longitudinal edge of the first electrode plate group, a second bank between the second longitudinal edge of the first electrode plate group and the third longitudinal edge of the second electrode plate group, and a third bank along the fourth longitudinal edge of the second electrode plate group;
forming a continuous first organic functional layer between the first bank and the second bank and above the first electrode plate group;
forming a continuous second organic functional layer between the second bank and the third bank and above the second electrode plate group; and
covering the first organic functional layer and the second organic functional layer with a counter electrode, wherein
the interlayer insulation film is formed with a first thickness below the first electrode plate group that is greater than a second thickness of the interlayer insulation film below the second electrode plate group,
the interlayer insulation film is provided with first contact holes and second contact holes, the plurality of first electrode plates each connected with the thin-film transistor layer via one of the first contact holes, the plurality of second electrode plates each connected with the thin-film transistor layer via one of the second contact holes,
each of the first contact holes includes a first depth that is greater than a second depth of each of the second contact holes and a first volume that is greater than a second volume of each of the second contact holes, each of the plurality of first electrode plates is formed with a first concavity shaped in conformity with a corresponding one of the first contact holes for connecting with the thin-film transistor layer, and each of the plurality of second electrode plates is formed with a second concavity shaped in conformity with a corresponding one of the second contact holes for connecting with the thin-film transistor layer, the first organic functional layer is formed with a third volume of a first portion of the first organic functional layer above each of the plurality of first electrode plates being substantially equal to a fourth volume of a second portion of the second organic functional layer above each of the plurality of second electrode plates, the first organic functional layer is formed with a first amount of the first organic functional layer being in the first concavity and greater than a second amount of the second organic functional layer that is in the second concavity, so that a first film thickness of the first organic functional layer in a first region other than above the first concavity in each of the plurality of first electrode plates is less than a second film thickness of the second organic functional layer in a second region other than above the second concavity in each of the plurality of second electrode plates.

23. The method of manufacturing an organic light-emitting display panel of claim 22, wherein
a first size of a first upper opening of each of the first contact holes is substantially equal to a second size of a second upper opening of each of the second contact holes.

24. The method of manufacturing an organic light-emitting display panel of claim 22, further comprising:
covering the first concavity with a first pixel defining layer and the second concavity with a second pixel defining layer, wherein
the first organic functional layer is formed above the first pixel defining layer, and
the second organic functional layer is formed above the second pixel defining layer.

25. The method of manufacturing an organic light-emitting display panel of claim 22, wherein
the first organic functional layer is formed continuous above the first electrode plate group by spraying first ink drops of a predetermined volume via an inkjet method, and
the second organic functional layer is formed continuous above the second electrode plate group by spraying second ink drops of substantially the predetermined volume via the inkjet method.

26. The method of manufacturing an organic light-emitting display panel of claim 25, wherein
a difference between the first film thickness of the first organic functional layer and the second film thickness of the second organic functional layer is larger than a first additional film thickness of the first organic functional layer when a number of ink drops of the predetermined volume sprayed on each of the plurality of first electrode plates via the inkjet method is increased by n drops, and smaller than a second additional film thickness of the first organic functional layer when the number of ink drops is increased by n+1 drops.

27. A method of manufacturing an organic light-emitting display panel, comprising:
preparing a substrate;
forming a thin-film transistor layer on the substrate;
forming an interlayer insulation film on the thin-film transistor layer;

forming, on the interlayer insulation film in a first line, a first electrode plate group that includes a plurality of first electrode plates that correspond to a first color, on the interlayer insulation film in a second line, a second electrode plate group that includes a plurality of second electrode plates that correspond to a second color, and, on the interlayer insulation film in a third line, a third electrode plate group that includes a plurality of third electrode plates that correspond to a third color, the first electrode plate group defining a first longitudinal edge and a second longitudinal edge that each extend along the first line, the second electrode plate group defining a third longitudinal edge and a fourth longitudinal edge that each extend along the second line, the third electrode plate group defining a fifth longitudinal edge and a sixth longitudinal edge that each extend along the third line;

forming a first bank along the first longitudinal edge of the first electrode plate group, a second bank between the second longitudinal edge of the first electrode plate group and the third longitudinal edge of the second electrode plate group, and a third bank between the fourth longitudinal edge of the second electrode plate group and the fifth longitudinal edge of the third electrode plate group, and a fourth bank along the sixth longitudinal edge of the second electrode plate group;

forming a continuous first organic functional layer between the first bank and the second bank and above the first electrode plate group;

forming a continuous second organic functional layer between the second bank and the third bank and above the second electrode plate group;

forming a continuous third organic functional layer between the third bank and the fourth bank and above the third electrode plate group; and covering the first organic functional layer, the second organic functional layer, and the third organic functional layer with a counter electrode, wherein the interlayer insulation film is formed with a first thickness below the first electrode plate group that is greater than both a second thickness of the interlayer insulation film below the second electrode plate group and a third thickness of the interlayer insulation film below the third electrode plate group, the interlayer insulation film is provided with first contact holes, second contact holes, and third contact holes, the plurality of first electrode plates each connected with the thin-film transistor layer via one of the first contact holes, the plurality of second electrode plates each connected with the thin-film transistor layer via one of the second contact holes, the plurality of third electrode plates each connected with the thin-film transistor layer via one of the third contact holes, each of the first contact holes includes a first depth that is greater than both a second depth of each of the second contact holes and a third depth of each of the third contact holes, and includes a first volume that is greater than both a second volume of each of the second contact holes and a third volume of each of the third contact holes, each of the plurality of first electrode plates is formed with a first concavity shaped in conformity with a corresponding one of the first contact holes for connecting with the thin-film transistor layer, each of the plurality of second electrode plates is formed with a second concavity shaped in conformity with a corresponding one of the second contact holes for connecting with the thin-film transistor layer, and each of the plurality of third electrode plates is formed with a third concavity shaped in conformity with a corresponding one of the third contact holes for connecting with the thin-film transistor layer, the first organic functional layer is formed with a fourth volume of a first portion of the first organic functional layer above each of the plurality of first electrode plates being substantially equal to a fifth volume of a second portion of the second organic functional layer above each of the plurality of second electrode plates and a sixth volume of a third portion of the third organic functional layer above each of the plurality of third electrode plates, and the first organic functional layer is formed with a first amount of the first organic functional layer being in the first concavity and greater than both a second amount of the second organic functional layer that is in the second concavity and a third amount of the third organic functional layer that is in the third concavity, so that a first film thickness of the first organic functional layer in a first region other than above the first concavity in each of the plurality of first electrode plates is less than both a second film thickness of the second organic functional layer in a second region other than above the second concavity in each of the plurality of second electrode plates and a third film thickness of the third organic functional layer in a third region other than above the third concavity in each of the plurality of third electrode plates.

\* \* \* \* \*